(12) United States Patent
Otsuka

(10) Patent No.: US 8,513,776 B2
(45) Date of Patent: Aug. 20, 2013

(54) SEMICONDUCTOR DEVICE AND METHOD CAPABLE OF SCRIBING CHIPS WITH HIGH YIELD

(75) Inventor: Satoshi Otsuka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 400 days.

(21) Appl. No.: 11/200,126

(22) Filed: Aug. 10, 2005

(65) Prior Publication Data

US 2005/0269702 A1 Dec. 8, 2005

Related U.S. Application Data

(63) Continuation of application No. PCT/JP03/05514, filed on Apr. 30, 2003, and a continuation of application No. PCT/JP2004/000583, filed on Jan. 23, 2004.

(51) Int. Cl.
*H01L 23/544* (2006.01)

(52) U.S. Cl.
USPC .................................. 257/620; 257/618

(58) Field of Classification Search
USPC ........................ 257/618–620, 797
See application file for complete search history.

(56) References Cited

U.S. PATENT DOCUMENTS

| | | | | |
|---|---|---|---|---|
| 5,136,354 | A * | 8/1992 | Morita et al. | ........... 257/620 |
| 6,261,883 | B1 | 7/2001 | Koubuchi et al. | |
| 6,335,560 | B1 | 1/2002 | Takeuchi | |
| 6,365,958 | B1 * | 4/2002 | Ibnabdeljalil et al. | ........... 257/620 |
| 6,498,089 | B2 | 12/2002 | Komada | |
| 6,717,267 | B1 | 4/2004 | Kunikiyo | |
| 7,009,233 | B2 * | 3/2006 | Uchiyama et al. | ........... 257/296 |

FOREIGN PATENT DOCUMENTS

| | | |
|---|---|---|
| CN | 1304175 A | 7/2001 |
| JP | 2-188942 | 7/1990 |
| JP | 2-211652 | 8/1990 |
| JP | 3-129855 A | 6/1991 |
| JP | 4-282852 | 10/1992 |
| JP | 6-338563 | 12/1994 |

(Continued)

OTHER PUBLICATIONS

Office Action dated Jan. 19, 2007 issued in corresponding Chinese Application No. 2004800009231.

(Continued)

*Primary Examiner* — Ori Nadav
(74) *Attorney, Agent, or Firm* — Fujitsu Patent Center

(57) ABSTRACT

A semiconductor device comprising scribe areas that include dicing areas for separating chip areas, a groove forming area surrounding each chip area, and includes interlayer insulating lamination disposed above the semiconductor wafer; a multilayer wiring structure formed in the interlayer insulating lamination, the multilayer wiring structure including wiring layers disposed in the chip area, and dummy wirings disposed in the chip area and the scribe area, the wiring layers and the dummy wirings being formed from same mother layers; a cover layer including a passivation layer, the cover layer covering the multilayer wiring structure; and a groove formed in each groove forming area, the groove surrounding the chip areas and extending from a surface of the semiconductor wafer and at least through the passivation layer; wherein the multilayer wiring structure includes no dummy wirings in the groove forming area at least in an uppermost wiring layer.

16 Claims, 28 Drawing Sheets

(56) References Cited

FOREIGN PATENT DOCUMENTS

| JP | 8-172062 | 7/1996 |
| JP | 9-045766 | 2/1997 |
| JP | 9-199449 | 7/1997 |
| JP | 10-335333 | 12/1998 |
| JP | 2000-340529 | 12/2000 |
| JP | 2002-270608 | 9/2002 |

OTHER PUBLICATIONS

Office Action dated Jul. 6, 2007 issued in corresponding Chinese Application No. 2004800009231.

"Japanese Office Action", Partial English-language translation, mailed Jul. 14, 2009 from JP Patent Office for correpsonding JP App. No. 2005-505818.

* cited by examiner

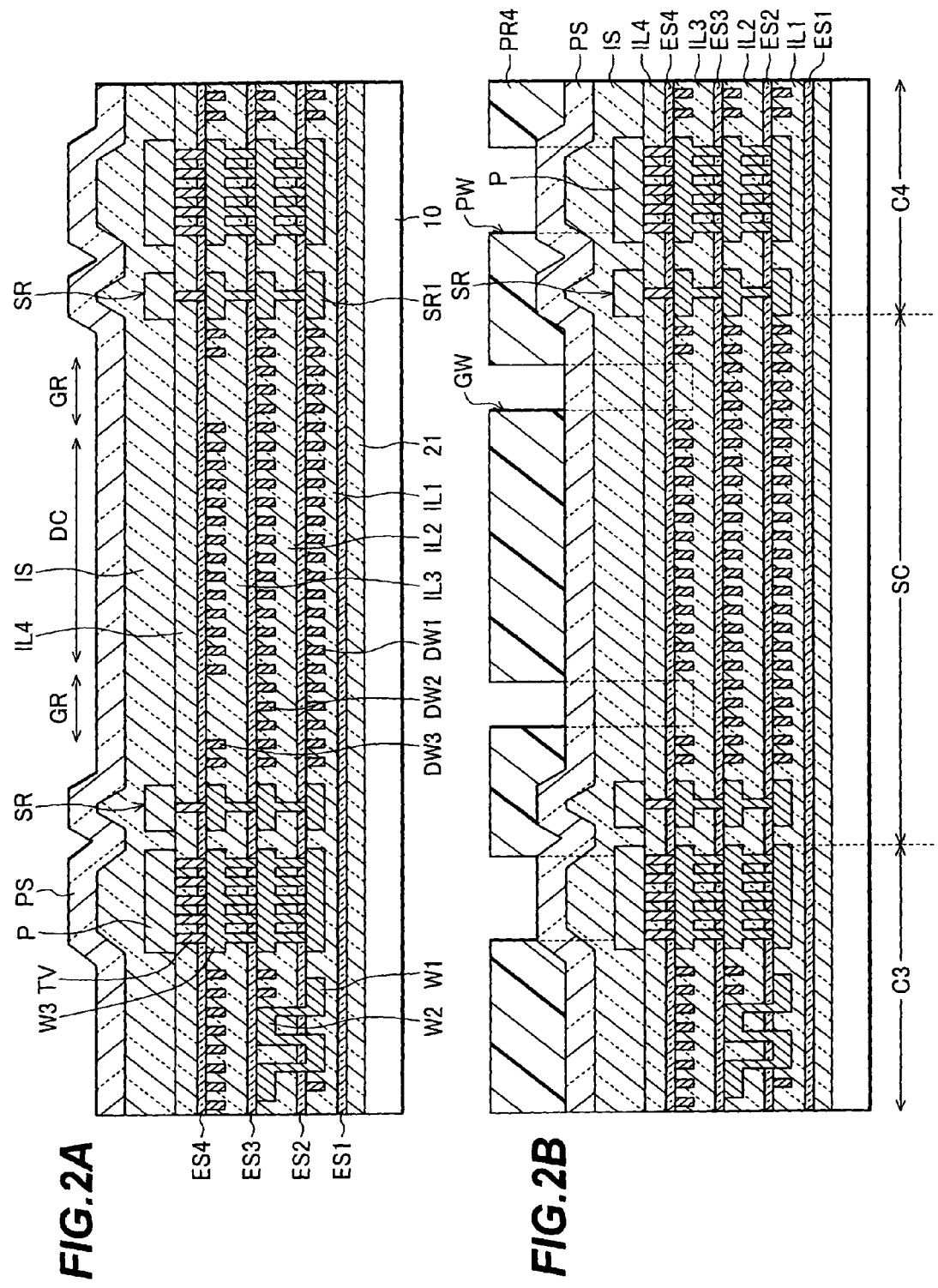

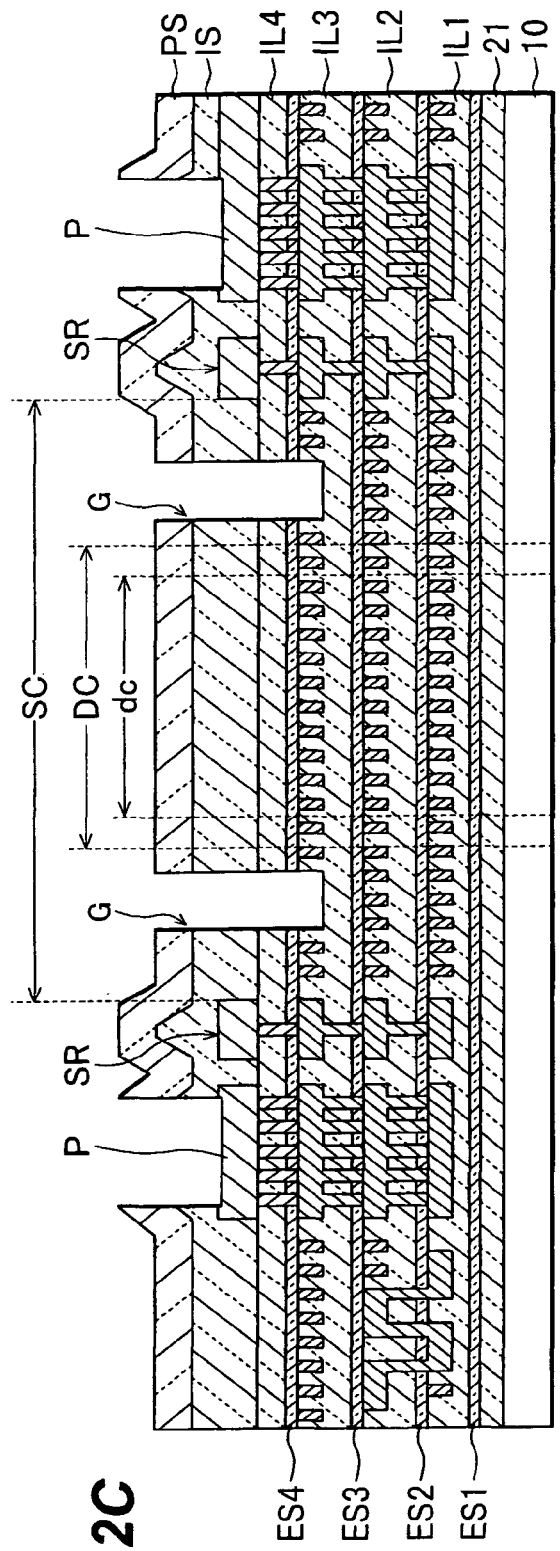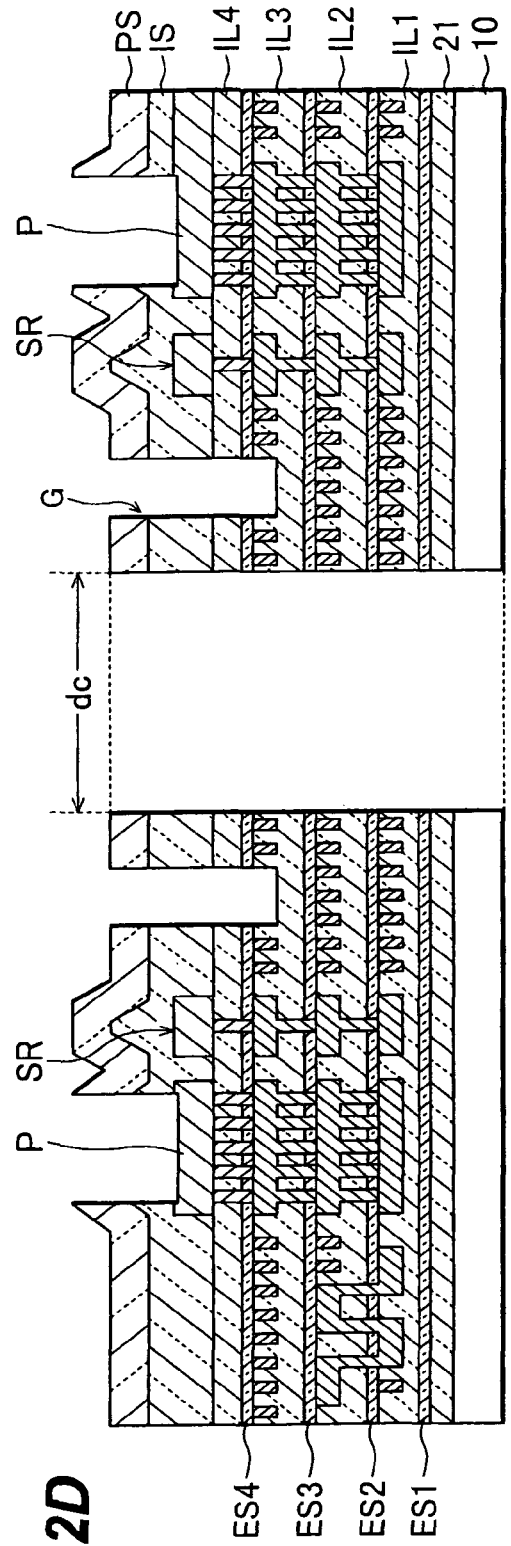

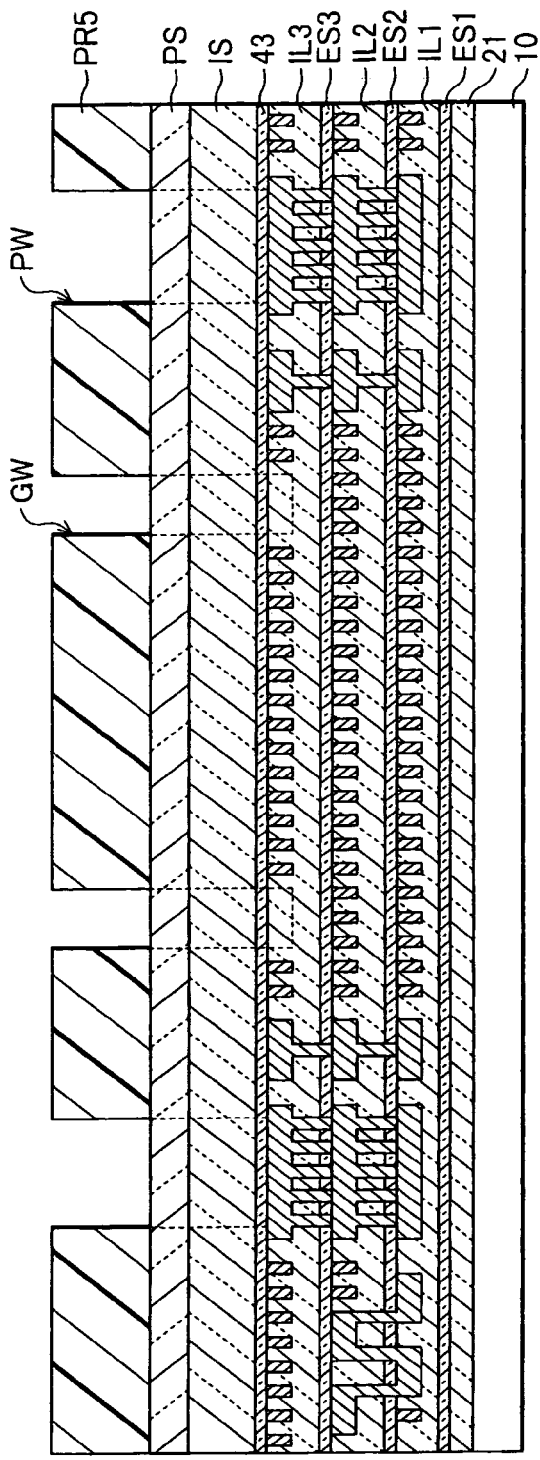
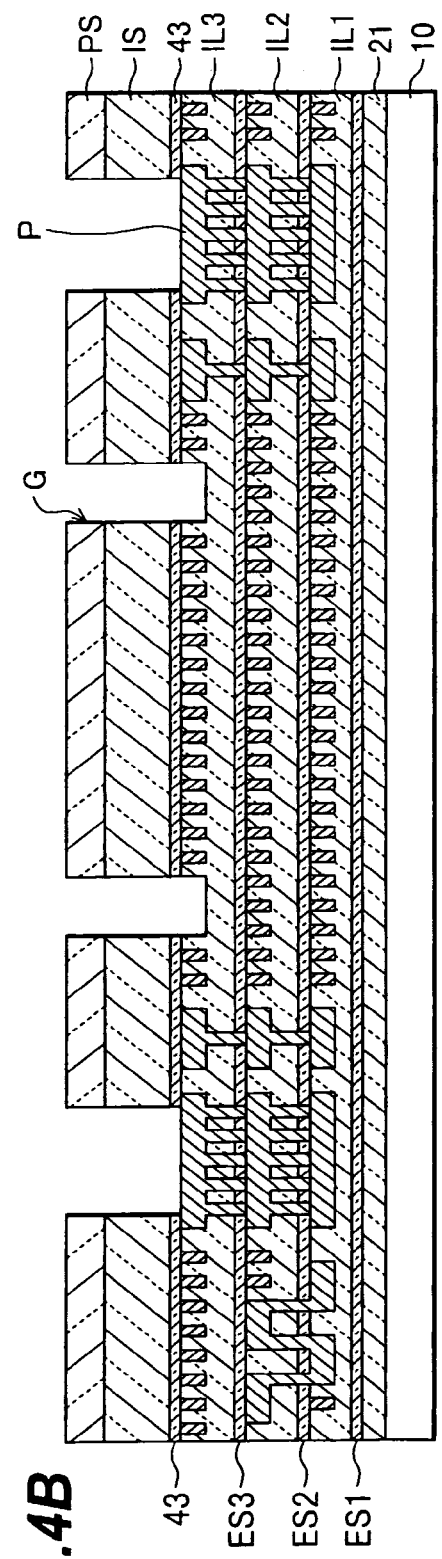
FIG.4A
FIG.4B

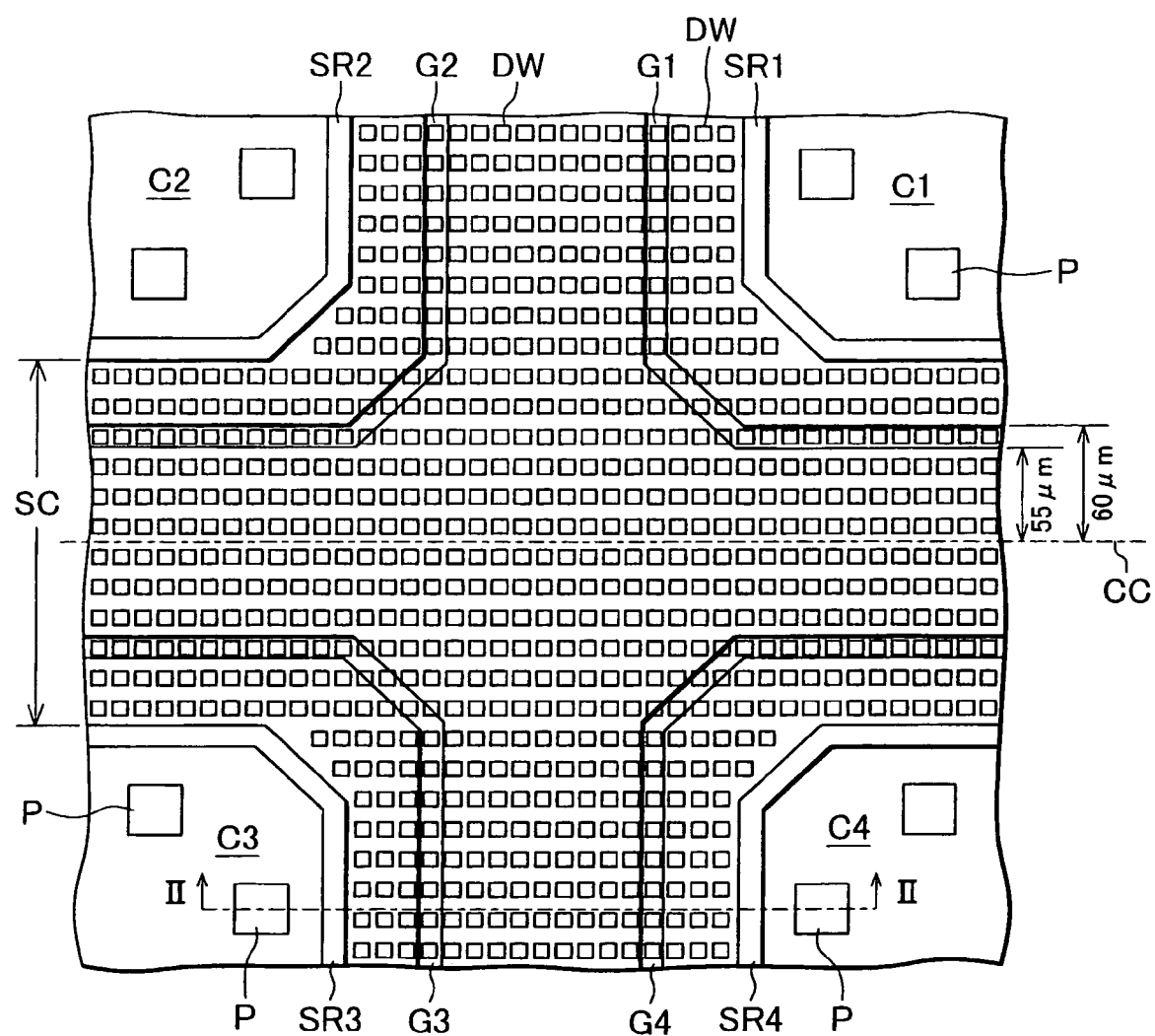

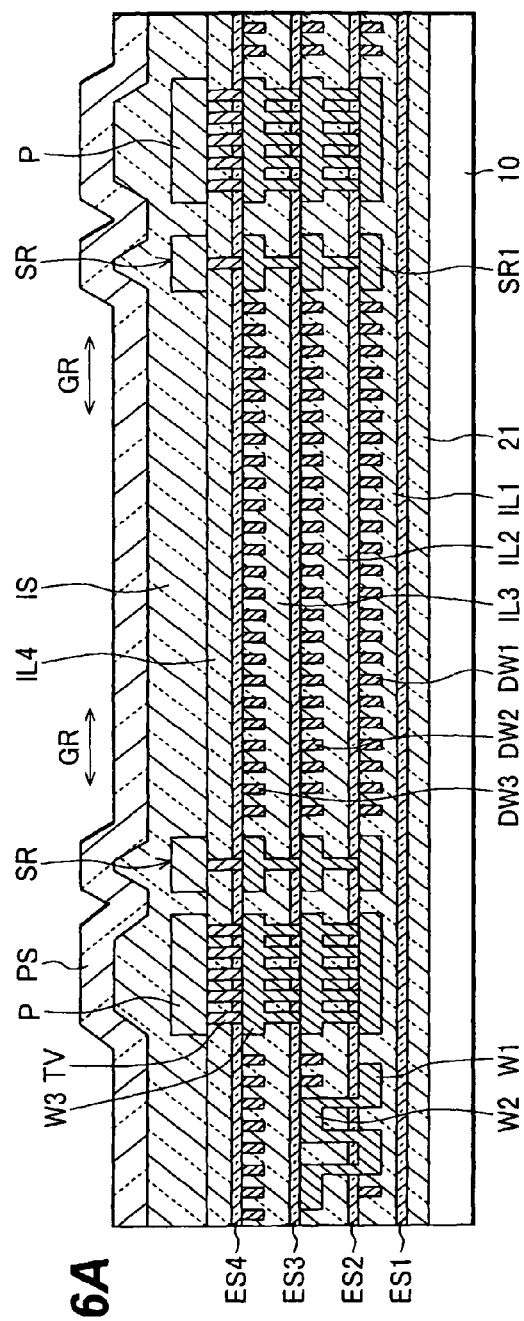
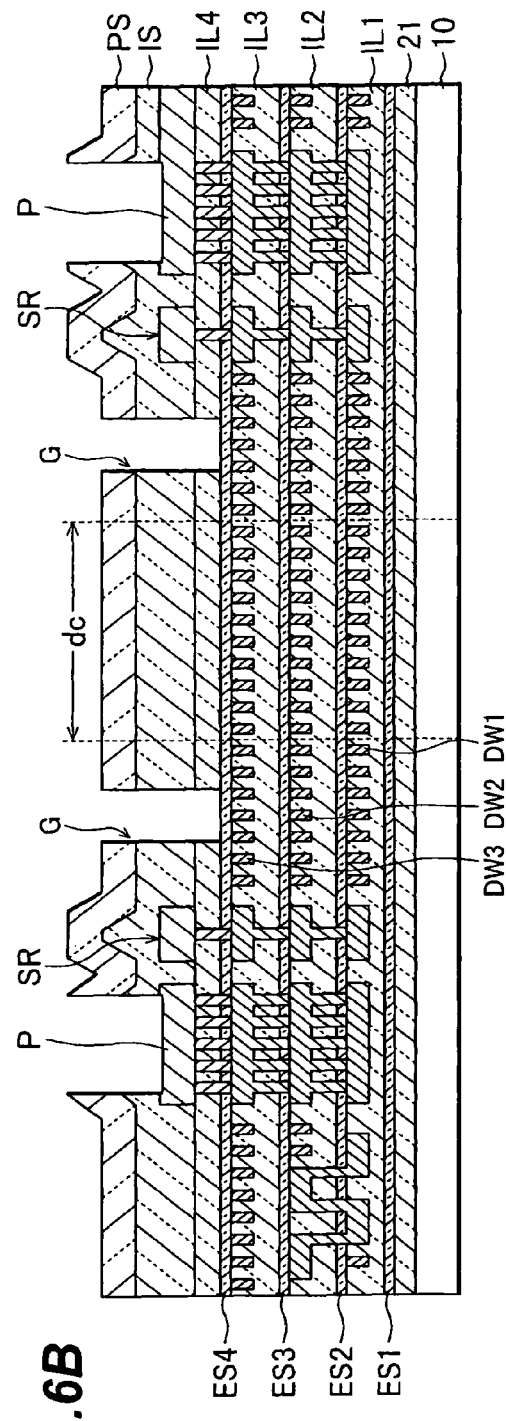
FIG.6A
FIG.6B

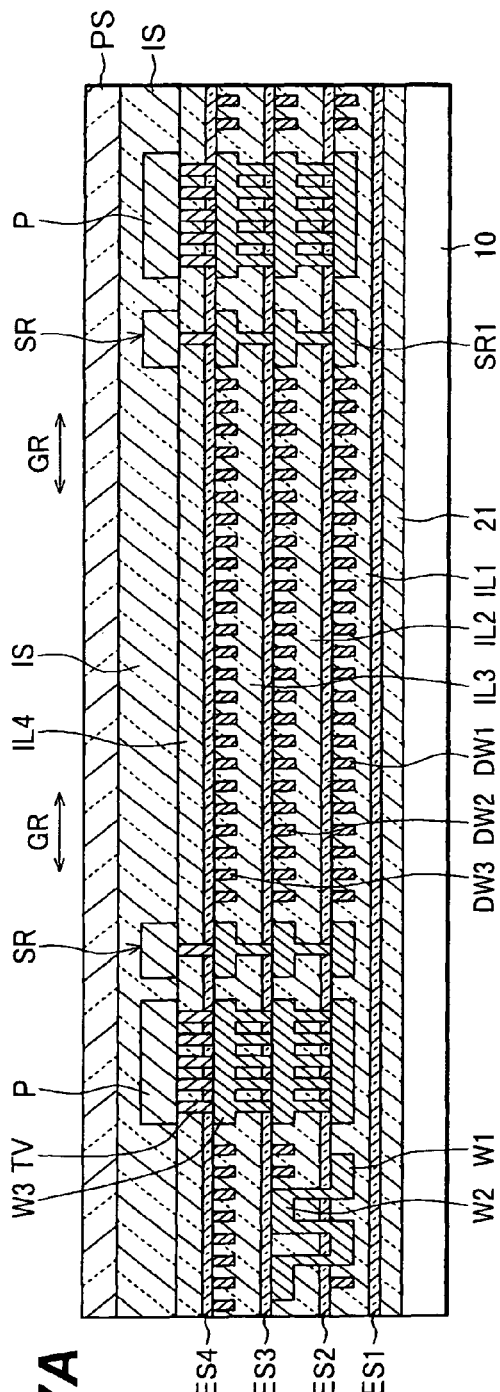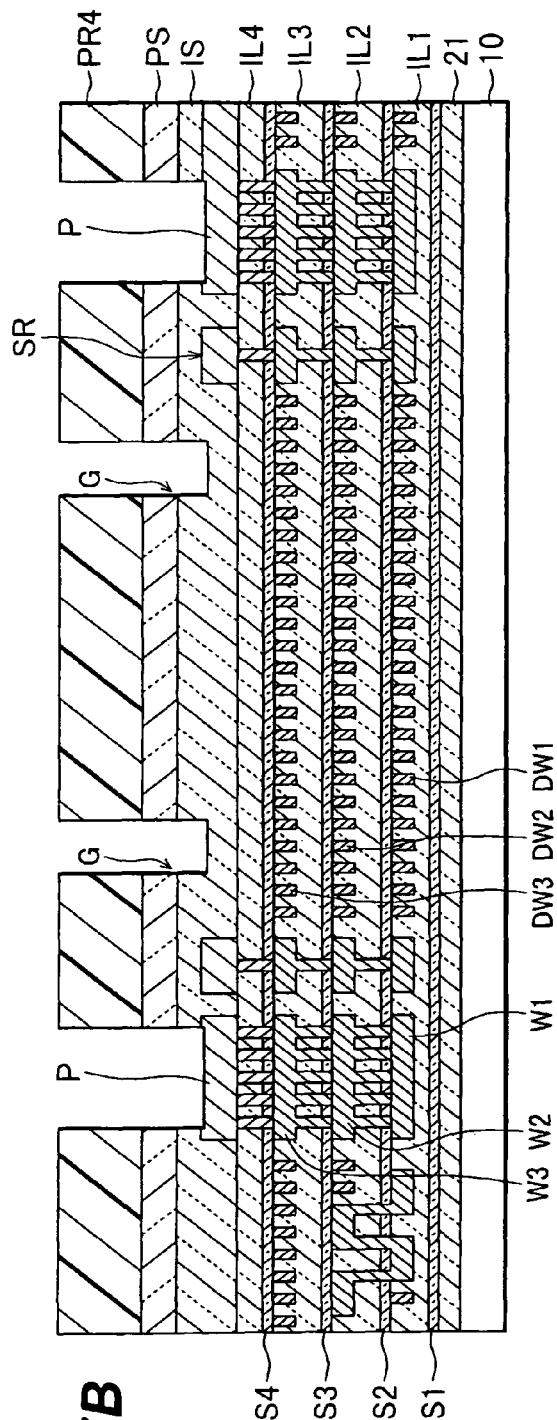

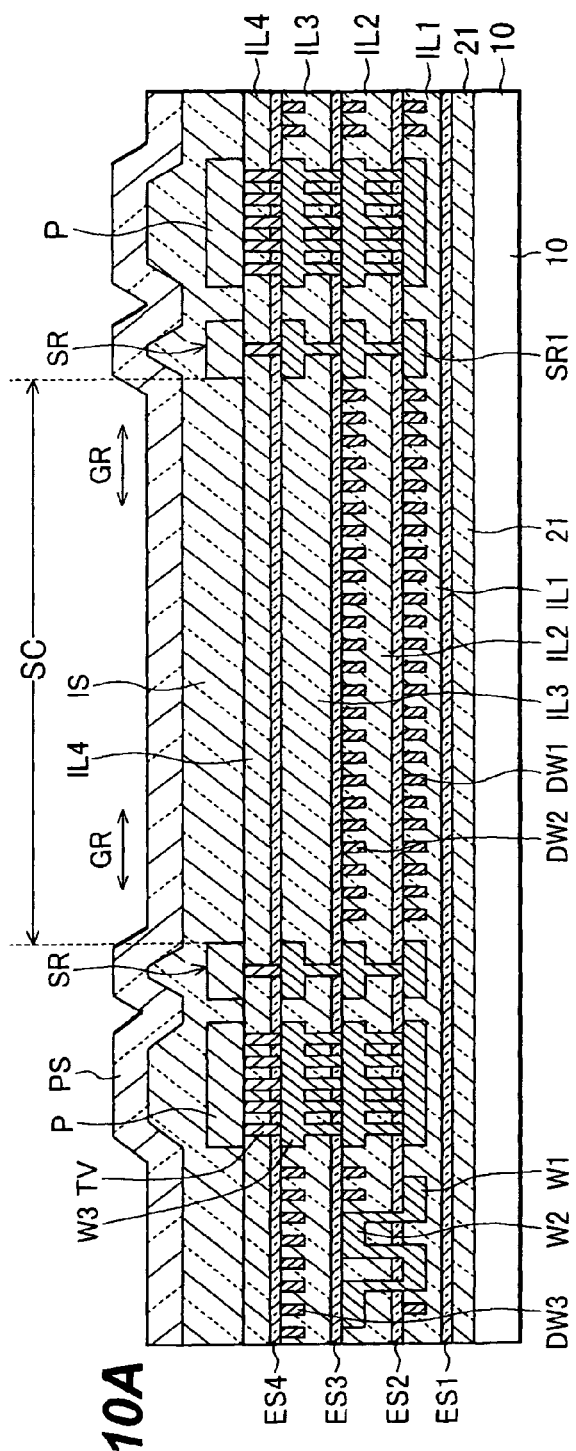
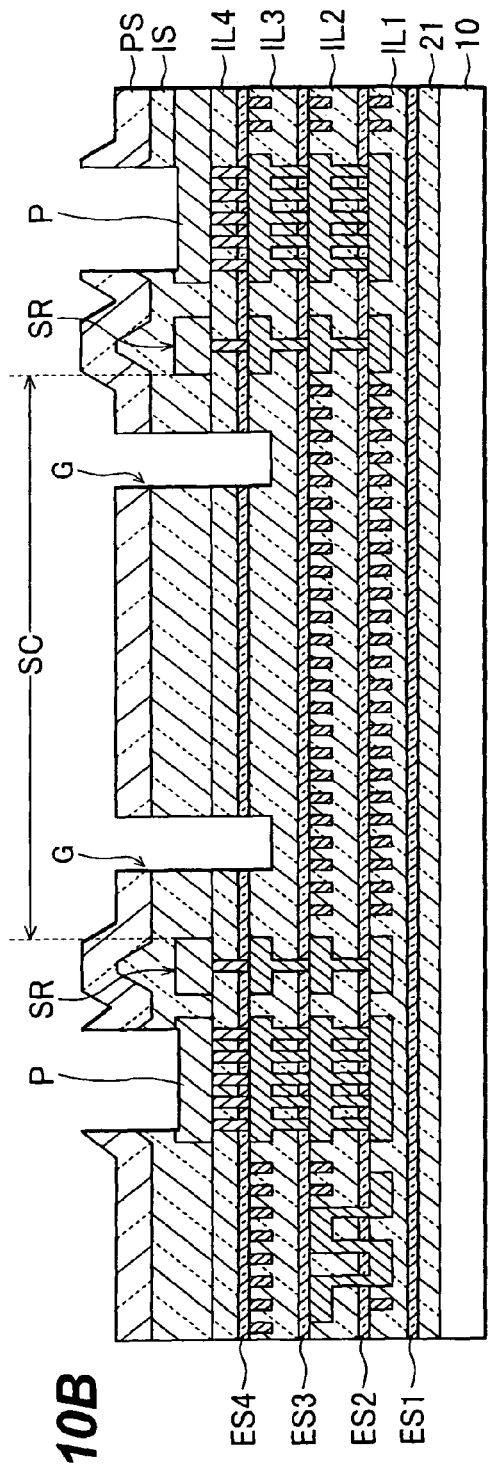

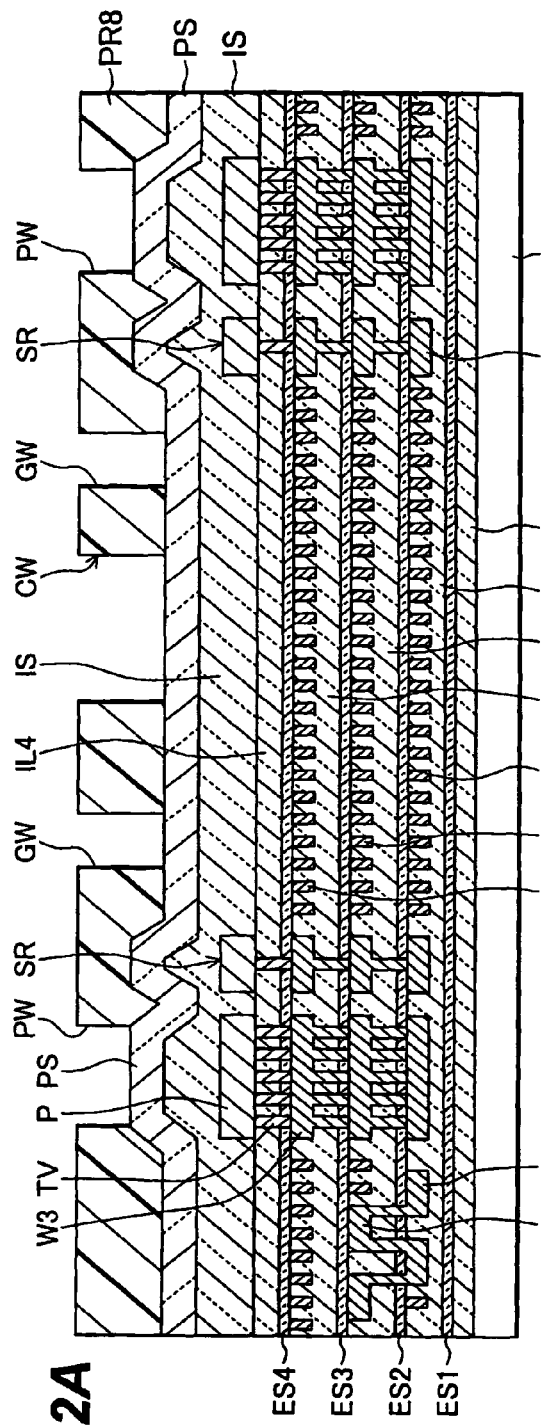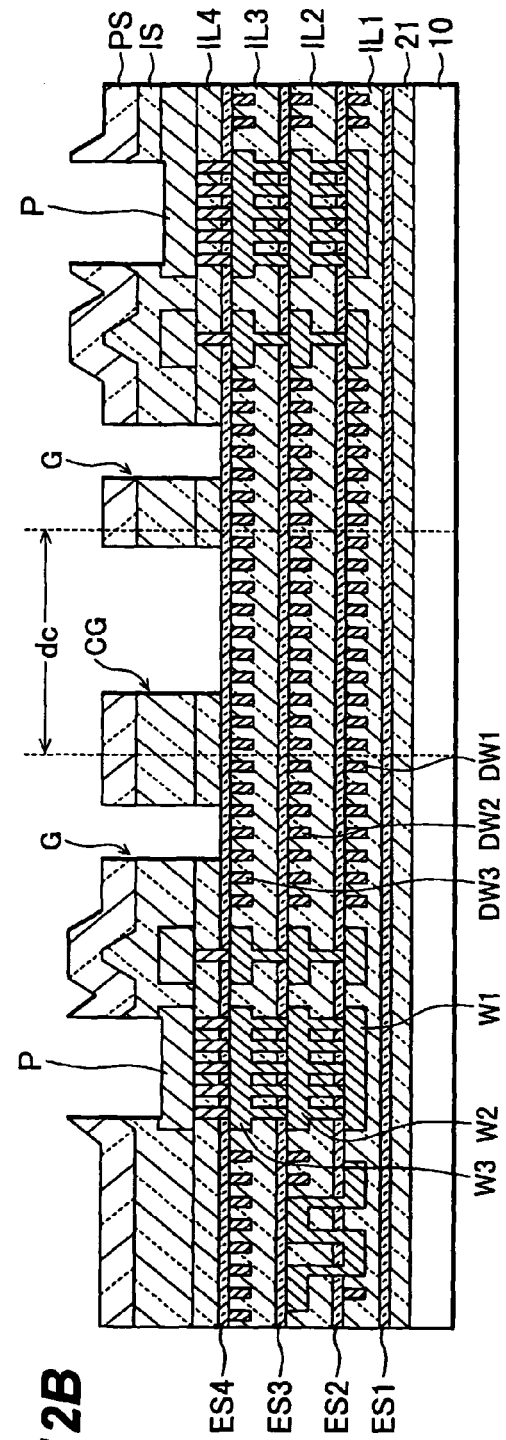
FIG.12A
FIG.12B

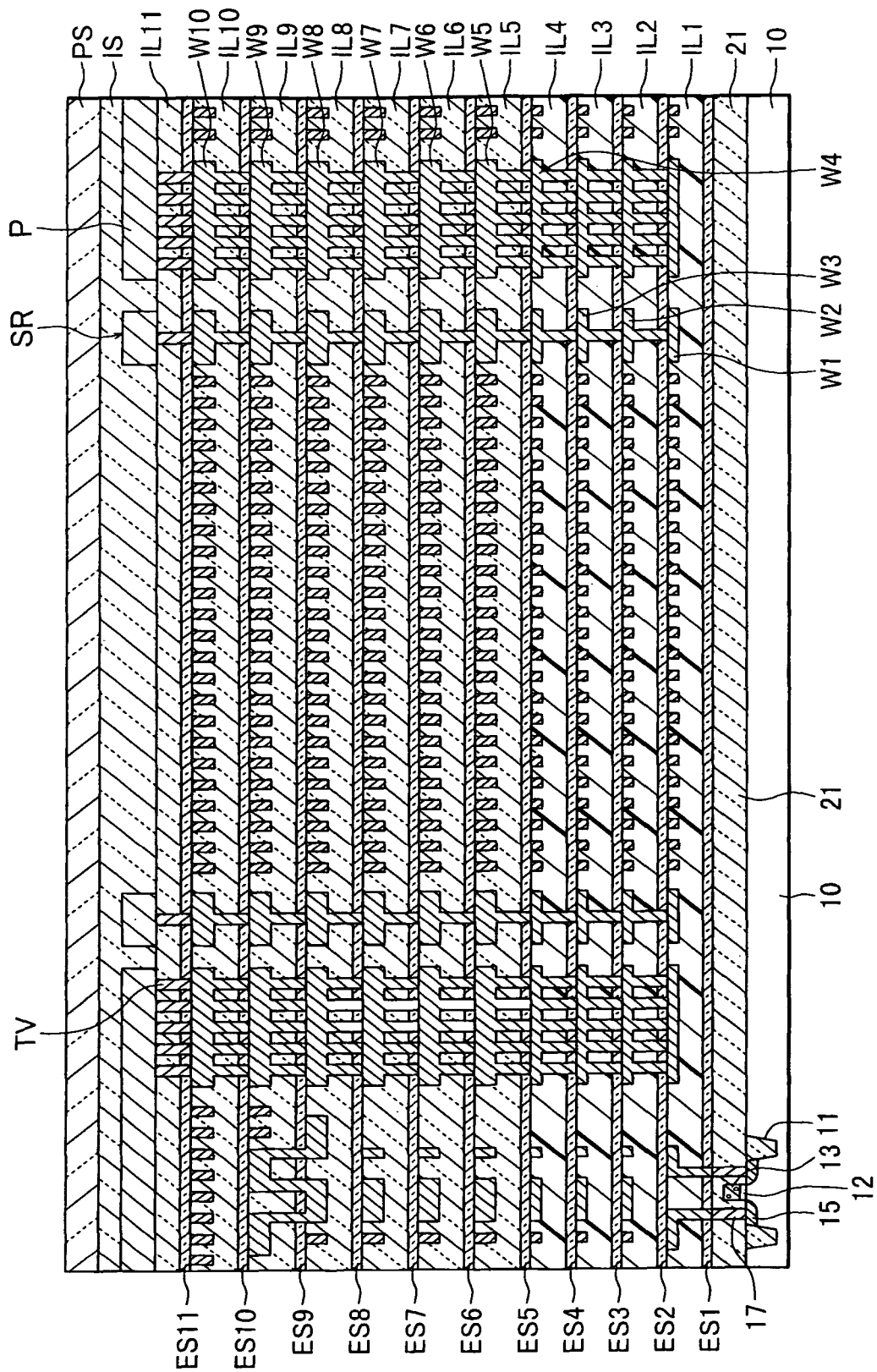

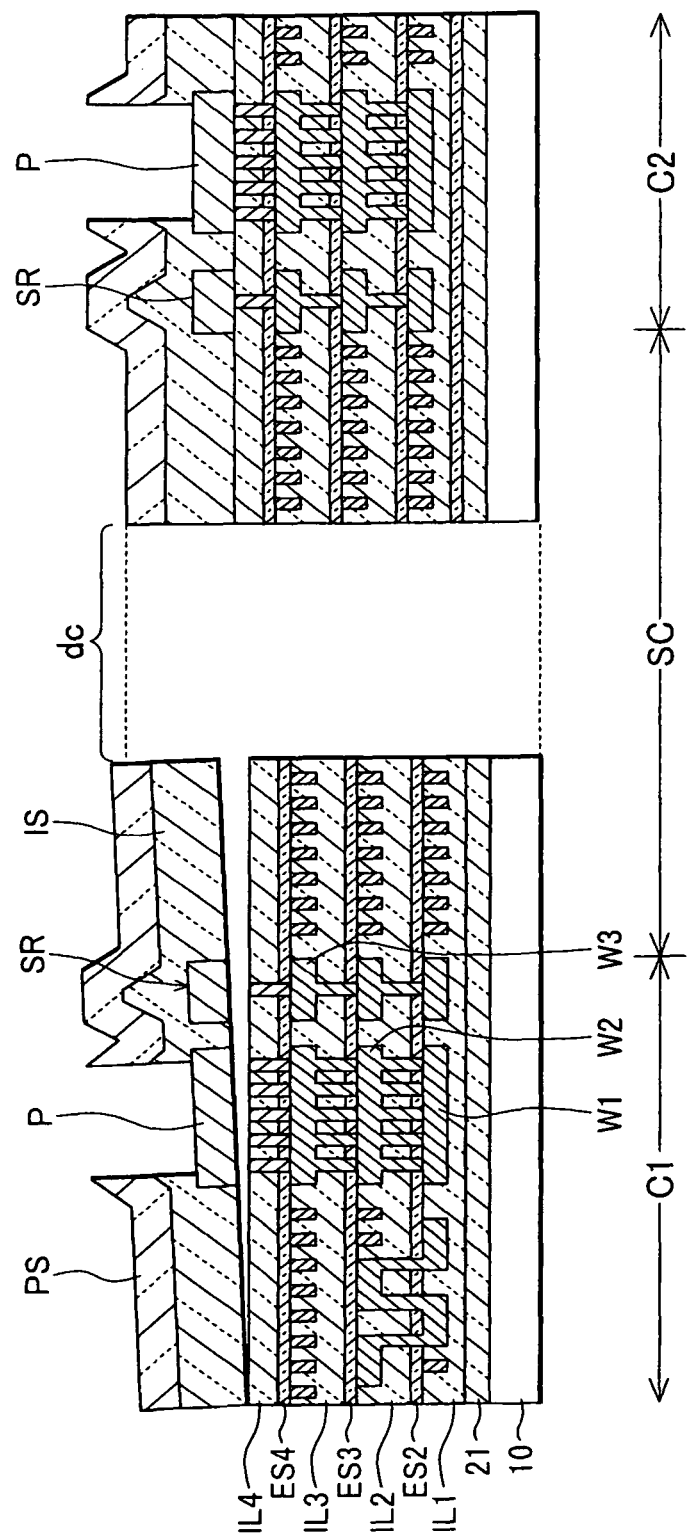

SEMICONDUCTOR DEVICE AND METHOD CAPABLE OF SCRIBING CHIPS WITH HIGH YIELD

CROSS REFERENCE TO RELATED APPLICATIONS

This application is a continuation of International application Nos. PCT/JP2004/000583 filed on Jan. 23, 2004, and PCT/JP2003/005514 filed on Apr. 30, 2003, the entire contents of which are incorporated herein by reference.

BACKGROUND OF THE INVENTION

A) Field of the Invention

The present invention relates to a method for fabricating a semiconductor device, a semiconductor wafer and a semiconductor device, and more particularly to a method for fabricating a semiconductor device having a multilayer wiring structure, a semiconductor wafer and a semiconductor device.

B) Description of the Related Art

In fabricating a semiconductor integrated circuit device, a number of chip areas divided by a scribe area are defined in a semiconductor wafer. Semiconductor elements are formed in each chip area, and an interconnection or wiring layer and an interlayer insulating layer are alternately stacked in each chip area. After the semiconductor integrated circuit structure is formed in each chip area, the semiconductor wafer is diced in the scribe area to separate each chip. Dicing is executed through chipping which dices the whole thickness of a semiconductor wafer with a dicing saw.

The scribe area is not used as an area for circuits. Although position alignment marks and a test element group are formed in some area of the scribe area, the other area has the exposed surface of the semiconductor wafer, along which the wafer is diced. The diced plane of each semiconductor chip has concave/convex surfaces like bur.

Japanese patent Laid-open Publication No. HEI-4-282852 proposes to dice a semiconductor wafer at a position between narrow insulating layers formed on both sides of a center line of a scribe area. The Publication describes that the insulating layer is harder than semiconductor so that concave/convex surfaces of the diced plane are prevented from extending over the scribe area and entering the chip.

Dicing a semiconductor water with a dicing saw poses sometimes the problem that the uppermost insulating layer of a semiconductor chip is wound around the dicing saw and cracked or peeled off, resulting in partial exposure of wirings and electrodes, electric short, corrosion and the like. Japanese Patent Laid-open Publication No. HEI-9-199449 proposes to form a crack preventive groove in the uppermost insulating layer.

FIG. 22A shows the structure of a crack preventive groove disclosed in Japanese Patent Laid-open Publication No. HEI-9-199449. Semiconductor elements are formed on the surface of a silicon substrate 101, and an interlayer insulating film 102 is formed thereon. A wiring 110 is formed on the interlayer insulting film 102, and another interlayer insulating film 104 is formed. A bonding pad 113 is formed being connected to the wiring 110. The uppermost insulating layer 105 and a polyimide protective layer 107 are formed, the uppermost insulating layer 105 being a silicon oxide layer or a lamination layer of a silicon oxide layer and a silicon nitride layer. At the same time when etching the protective layer 107 and insulating layer 105 to expose the surface of the bonding pad 113, a crack preventive groove 108 is formed through the protective layer 107 and insulating layer 105. Even if the protective layer 107 and insulating layer 105 are wound around a dicing saw at the chip end plane and cracked, this crack is stopped at the crack preventive groove 108.

In order to improve the integration degree and operation speed of a semiconductor integrated circuit device, constituent semiconductor elements are made finer. The finer the semiconductor elements, a higher resolution is required for an exposure process and an aperture ratio becomes larger and a depth of focus becomes shallower. In order to focus an image at a shallow depth of focus, an underlying layer of resist is desired to be flat. A planarizing process such as chemical mechanical polishing (CMP) is often used.

Japanese Patent Laid-open Publication No. HEI-10-335333 discloses an integrated circuit using wirings of W or Al and teaches that even if a wiring is formed and thereafter an interlayer insulating film is formed and CMP is performed, the surface cannot be planarized perfectly, and that the wiring intervals are set within a constant range, e.g., from the narrowest to twice the narrowest, at the maximum, in order to planarize the surface of the interlayer insulating film. By disposing dummy wirings not only in the chip area but also in the scribe area, it becomes possible to form an insulating layer having a flat surface in the whole area of a wafer.

FIG. 22B shows an example of the structure of a semiconductor devices having dummy wirings disposed in a chip area and in the whole scribe area, disclosed in Japanese Patent Laid-open Publication No. HEI-10-335333. In FIG. 22B, a pad—peripheral circuit area B is shown in the right area and a scribe area A is shown in the left area.

In the surface layer of a silicon substrate 101, an element isolation region 103 is formed by shallow trench isolation (STI). A gate insulating film and a gate electrode are formed on an active region of the silicon substrate, to form a MOS transistor. At the same time, a wiring 106 of the same material as that of the gate electrode is also formed on the element isolation region 103. An interlayer insulating film 109 is formed covering the gate electrode 109.

A wiring layer having wirings 110 and dummy wirings 111 is formed on the interlayer insulating film 109. The dummy wirings 111 are disposed not only in the pad—peripheral circuit area B but also in the scribe area A. The wiring layers 110 and 111 are covered with an interlayer insulating film 112 having a planarized surface. Similarly, wirings 114 and dummy wirings 115 are formed on the interlayer insulating film 112, and covered with an interlayer insulating film 116 having a planarized surface. Wirings 117 and dummy wirings 118 are formed on the interlayer insulating film 116 and covered with an interlayer insulating film 119. Wirings 120 and dummy wirings 121 are formed on the interlayer insulating film 119 and covered with an interlayer insulating film 122.

The uppermost wiring layer including a pad 113 and wirings 123 is formed on the interlayer insulating film 122, and covered with a cover layer constituted of an insulating layer 124 and a passivation layer 125. The surface of the pad 113 is exposed by selectively etching the passivation layer 125 and insulating layer 124.

The above-cited Publication describes that this structure can planarize perfectly the whole surface of a wafer.

SUMMARY OF THE INVENTION

An object of this invention is to provide a method for fabricating a semiconductor device capable of dicing a scribe area with a high manufacture yield.

Another object of this invention is to provide a method for fabricating a semiconductor device capable of improving a process margin to be limited by a dicing process.

Still another object of this invention is to provide a semiconductor wafer and a semiconductor device capable of high yield fabrication at a high process margin.

Another object of this invention is to provide a method for fabricating a semiconductor device, a semiconductor wafer and a semiconductor device capable of suppressing adverse effects due to adopting dummy wirings and suppressing a crack of an insulating layer during a dicing process.

According to one aspect of the present invention, there is provided a semiconductor device fabrication method comprising steps of: (a) preparing a semiconductor wafer having a plurality of chip areas formed with semiconductor elements and a scribe area having a dicing area in the scribe area for separating the plurality of chip areas, wherein a groove forming area is defined surrounding each chip area at a position outside of the dicing area in the scribe area; (b) disposing a multilayer wiring structure including dummy wirings above the semiconductor wafer, the multilayer wiring structure having interlayer insulating films and wiring layers alternately formed; (c) forming a cover layer including a passivation layer, the cover layer covering the multilayer wiring structure; and (d) forming a groove in the groove forming area, the groove surrounding each of the plurality of chip areas and extending from a surface of the semiconductor wafer and at least through the passivation layer.

According to another aspect of the present invention, there is provided a semiconductor wafer comprising: a semiconductor wafer having a plurality of chip areas formed with semiconductor elements and a scribe area having a dicing area in the scribe area for separating the plurality of chip areas, wherein a groove forming area is defined surrounding each chip area at a position outside of the dicing area in the scribe area; a multilayer wiring structure including dummy wirings formed above the semiconductor wafer, the multilayer wiring structure having interlayer insulating films and wiring layers alternately formed; a cover layer including a passivation layer, the cover layer covering the multilayer wiring structure; and a groove formed in the groove forming area, the groove surrounding each of the plurality of chip areas and extending from a surface of the semiconductor wafer and at least through the passivation layer.

According to another aspect of the present invention, there is provided a semiconductor device comprising: a semiconductor substrate having a chip area formed with semiconductor elements and a scribe area at a periphery of the chip area, wherein a groove forming area is defined in the scribe area, surrounding the chip; a multilayer wiring structure including dummy wirings formed above the semiconductor substrate, the multilayer wiring structure having interlayer insulating films and wiring layers alternately formed; a cover layer including a passivation layer, the cover layer covering the multilayer wiring structure; and a groove formed in the groove forming area, the groove extending from a surface of the semiconductor substrate and at least through the passivation layer.

A wiring layer other than the uppermost wiring layer is preferably a copper wiring layer of low resistance. In a multilayer wiring, a lower level interlayer insulating film is preferably made of low dielectric constant material.

BRIEF DESCRIPTION OF THE DRAWINGS

FIG. 2A to 2E are cross sectional views illustrating main processes of a semiconductor device fabrication method according to an embodiment of the present invention.

FIGS. 4A and 4B are cross sectional views illustrating main processes of a semiconductor device fabrication method according to another embodiment of the present invention.

FIG. 5 is a schematic plan view of a semiconductor wafer according to another embodiment of the present invention.

FIGS. 6A and 6B are cross sectional views illustrating main processes of a semiconductor device fabrication method according to the embodiment shown in FIG. 5.

FIGS. 7A and 7B are cross sectional views illustrating main processes of another semiconductor device fabrication method according to the embodiment shown in FIG. 5.

FIGS. 10A and 10B are cross sectional views illustrating main processes of another semiconductor device fabrication method according to the embodiment shown in FIG. 9.

FIGS. 12A and 12B are cross sectional views illustrating main processes of another semiconductor device fabrication method according to the embodiment shown in FIG. 11.

FIG. 13 is a schematic cross sectional view showing the structure of a semiconductor device having ten wiring layers according to a first embodiment.

FIG. 23 is a cross sectional view showing the study results of prior art made by the present inventor.

DESCRIPTION OF THE PREFERRED EMBODIMENTS

Prior to describing embodiments of the present invention, the study results made by the present inventor will be described.

Figure 22A:
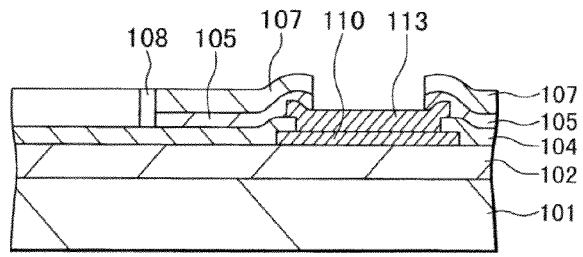
FIGS. 22A and 22B are schematic cross sectional views showing the structure of a crack preventive groove to be used for preventing a crack during a chip dicing according to prior art and the structure of a semiconductor device having dummy wirings.
Figure 22B:
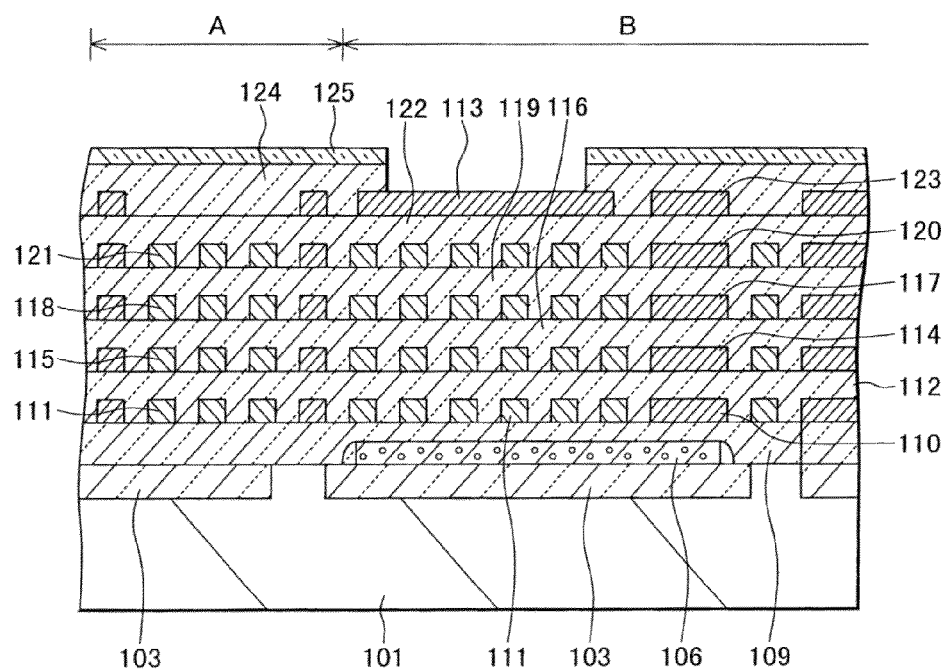

If dummy wirings are disposed also in the scribe area as in the structure shown in FIG. 22B, the flatness of the whole wafer surface can be easily realized. Similar to the pad—peripheral circuit area, dummy wirings are disposed in the scribe area and covered with the cover layer including the passivation layer 125.

FIG. 23 is a schematic cross sectional view showing the structure of a semiconductor device actually used for the studies by the present inventor. Semiconductor elements are formed on a semiconductor substrate 10 and covered with an insulating layer 21. A multilayer wiring is formed on the insulating layer 21. A lamination of the multilayer wiring insulation layer includes an interlayer insulating film IL1, an etch stopper and copper diffusion preventive layer ES2, an interlayer insulating film IL2, an etch stopper and copper diffusion preventing layer ES3, an interlayer insulating film IL3, an etch stopper and copper diffusion preventing layer ES4, an interlayer insulating film IL4, the upper most insulating layer IS and a passivation layer PS.

In the insulating lamination layer of the etch stopper layer ESi and interlayer insulating film IL1, a first metal (copper) wiring layer W1, a second metal (copper) wiring layer W2 and a third metal (copper) wiring layer W3 respectively including dummy wirings were buried. The upper most wiring layer including an aluminum layer was formed above the third metal wiring layer W3 via a via portion. The uppermost wring layer does not have dummy wirings, and partially has a pad P and a seal ring SR. The uppermost wiring layer is covered with a cover layer constituted of the uppermost insulating layer IS and a passivation layer PS. The upper surface of the pad P is exposed by forming an opening through the passivation layer PS and upper most insulating layer IS.

In the structure shown in FIG. 23, a semiconductor wafer has a plurality of chip areas C1 and C2, and a scribe area SC is defined between chip areas. By dicing a region dc in the scribe area SC, the wafer is separated into chips C1 and C2. Since the cover layer contains stress, if dicing is performed under the existence of the cover layer, a crack is likely to be formed at the interface of the insulating layer because of an impact force during dicing. For example, as shown in FIG. 23, an impact force during dicing peels off the uppermost insulating layer IS of the cover layer of the chip C1 at the interface of the underlying interlayer insulating film IL4 and this peel-off progresses inside the chip. Not only at the interface of the cover layer, crack may be formed at the interface of a lower level interlayer insulating film. A crack or peel-off does not remain in the peripheral area of a chip, but it is likely to enter the inside of a circuit area. As a crack enters the inside of a chip, this chip becomes defective, lowering a manufacture yield. If low dielectric constant (low-k) material is used for an interlayer insulating film of a multilayer wiring, a crack is likely to be formed at the interface of the interlayer insulating film.

The passivation layer PS is made of silicon nitride or silicon oxynitride and has therein stress. It can be considered that dicing the passivation layer during the dicing process concentrates the stress upon the dicing plane, causing a peel-off or crack.

The present inventor has studied to remove the passivation layer PS at least in the scribe area before the dicing process. It can be considered that if the passivation layer PS in the scribe area is removed, a distance between the dicing plane and the passivation layer becomes long and the stress at the dicing plane is relaxed. When the pad is opened, the cover layer including the passivation film and underlying insulating layer is etched. At the same time when the pad opening etching is performed, the etching is performed also in the scribe area so that the cover layer including the passivation layer in the scribe area can be removed.

Figure 24:
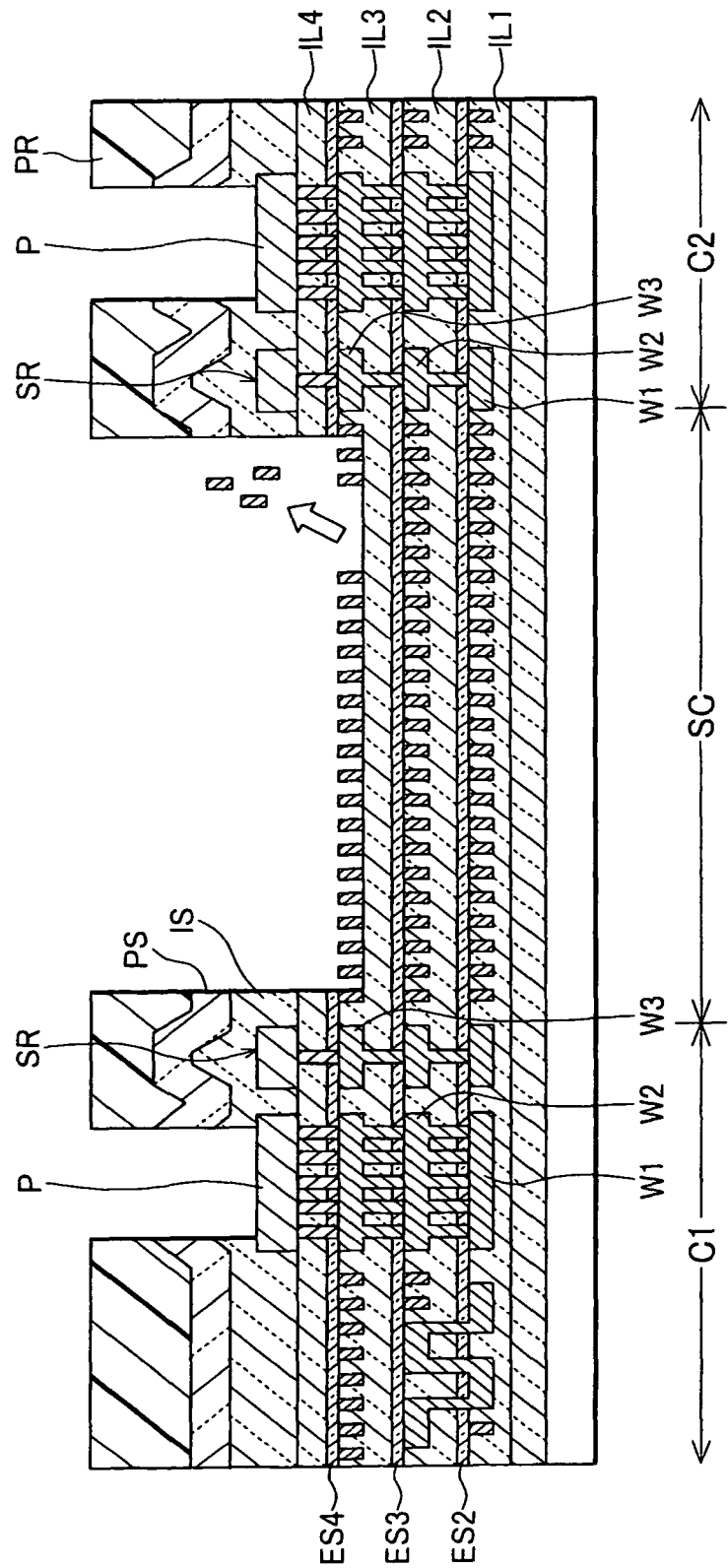
FIG. 24 is a schematic cross sectional view showing other study results made by the present inventor.

FIG. 24 is a schematic cross sectional view of a semiconductor wafer illustrating that the bonding pad opening process for the semiconductor wafer having the structure shown in FIG. 23 also etches the cover layer in the scribe area SC between sealing rings SR of adjacent chips C1 and C2. The semiconductor wafer has the same structure as that shown in FIG. 23. After the pads P and the uppermost wiring layer including the seal rings SR were formed, the uppermost insulating layer IS and passivation layer PS were formed, and a photoresist pattern PR was formed on the passivation layer PS, opening the pads P and scribe area SC.

The passivation layer PS and uppermost insulating layer IS are etched by dry etching using plasma, to expose the pads P. When the uppermost insulating layer IS is etched and the pads P are exposed, in the scribe area the uppermost insulating layer IS is etched and the underlying fourth interlayer insulating film IL4 is exposed. In this case, over-etch is performed so that in the scribe area, the fourth interlayer insulating film IL4, fourth etch stopper layer ES4 and third interlayer insulating film IL3 under the uppermost insulating layer IS are etched.

In this case, the dummy wirings buried in the third interlayer insulating film IL3 are exposed in the plasma and blown and scattered while the insulating film is etched. Dummy wirings blown and scattered in the plasm attach the surface of the semiconductor wafer and are hard to be removed even by pure water washing.

As described above, if dicing is performed in the state that dummy wirings disposed in the scribe area are covered with the insulating layer and passivation layer, a peel-off or crack is formed between the insulating layers. Furthermore, if dry etching is performed to remove the cover layer, the over-etch makes dummy wirings be blown and scattered.

The cover layer in the whole scribe area is not removed but a groove having a limited width is formed through the cover layer, surrounding in the scribe area the chip. The present inventor has found that a peel-off or crack entering from the dicing plane is stopped near at the groove.

Figure 25:
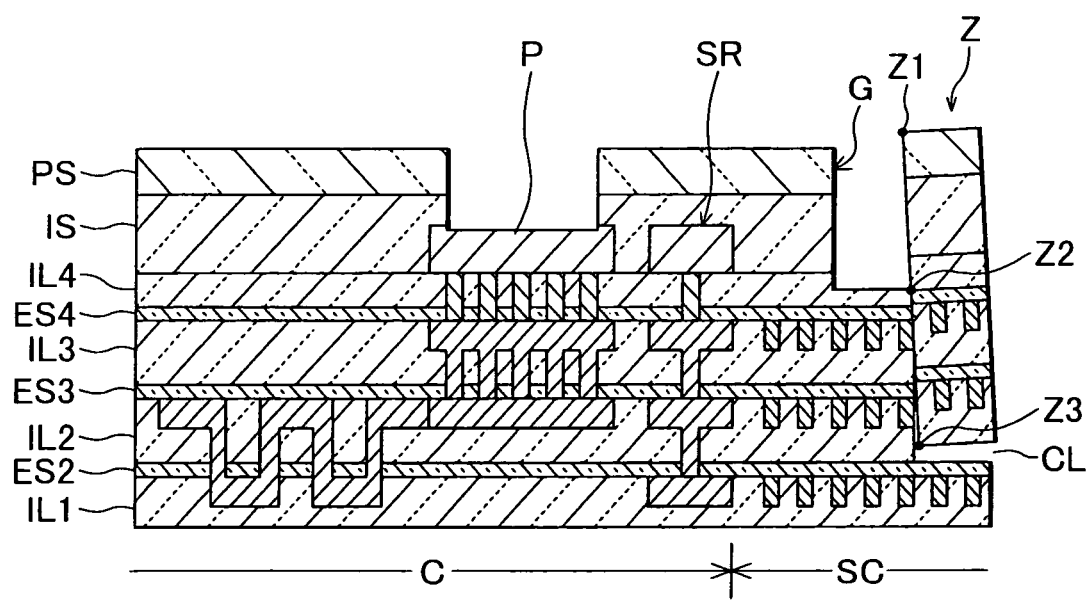
FIG. 25 is a schematic cross sectional view illustrating a phenomenon found by the present inventor.

FIG. 25 schematically illustrates this phenomenon. The structure of a semiconductor device is similar to that shown in FIGS. 23 and 24 and has multilayer wirings having dummy wirings disposed in the chip area C and scribe area SC. Although the planarized uppermost insulating layer IS is shown, similar phenomena were observed also for the uppermost insulating layer not planarized. The cover layer PS and IS above the pad is removed to expose the pad, and a groove G is formed surrounding the chip area C by removing the cover layer in an outer side region of the scribe area SC.

As the right side plane shown in FIG. 25 is diced, it was found that when a crack was formed at the chip end plane, the layers indicated by Z upper than the crack were peeled off at the position outside the groove, and the crack stopped at the groove. Although it is obvious that a crack can be stopped at the groove if the groove is formed deeper than the position where a crack is formed, the crack can be stopped by the shallower groove.

Why a crack at a position deeper than a shallow groove can be stopped may be ascribed to the following. The passivation layer PS has therein a tensile stress which extends inward as indicated by arrows at the outer side inner wall Z1 of the groove G. As an outer side Z2 on the bottom of the groove G is considered as a fulcrum, the stress extending inward at a point Z1 pushes outward the layers lower than the fulcrum Z2. As the crack CL is formed and the coupling between the upper and lower layers disappears, the force pushing the layers outward is concentrated upon the upper layers. Therefore, a cleavage is formed from the crack CL toward the fulcrum Z2. As the stress is relieved by the cleavage, the crack stops.

By utilizing this phenomenon, it becomes possible to prevent a crack from extending to the inside of the chip area in the state that the cover layer is left in the scribe area. Even if dummy wirings are formed in the scribe area, it is sufficient if the groove with a limited width is formed so as not to blow and scatter the dummy wirings. It is desired that the groove is at least deeper than the passivation layer, and more practically deeper than the cover layer. However, the groove is not required to reach the depth where a crack is formed. In the following, more specific embodiments of the present invention will be described.

Figure 1:
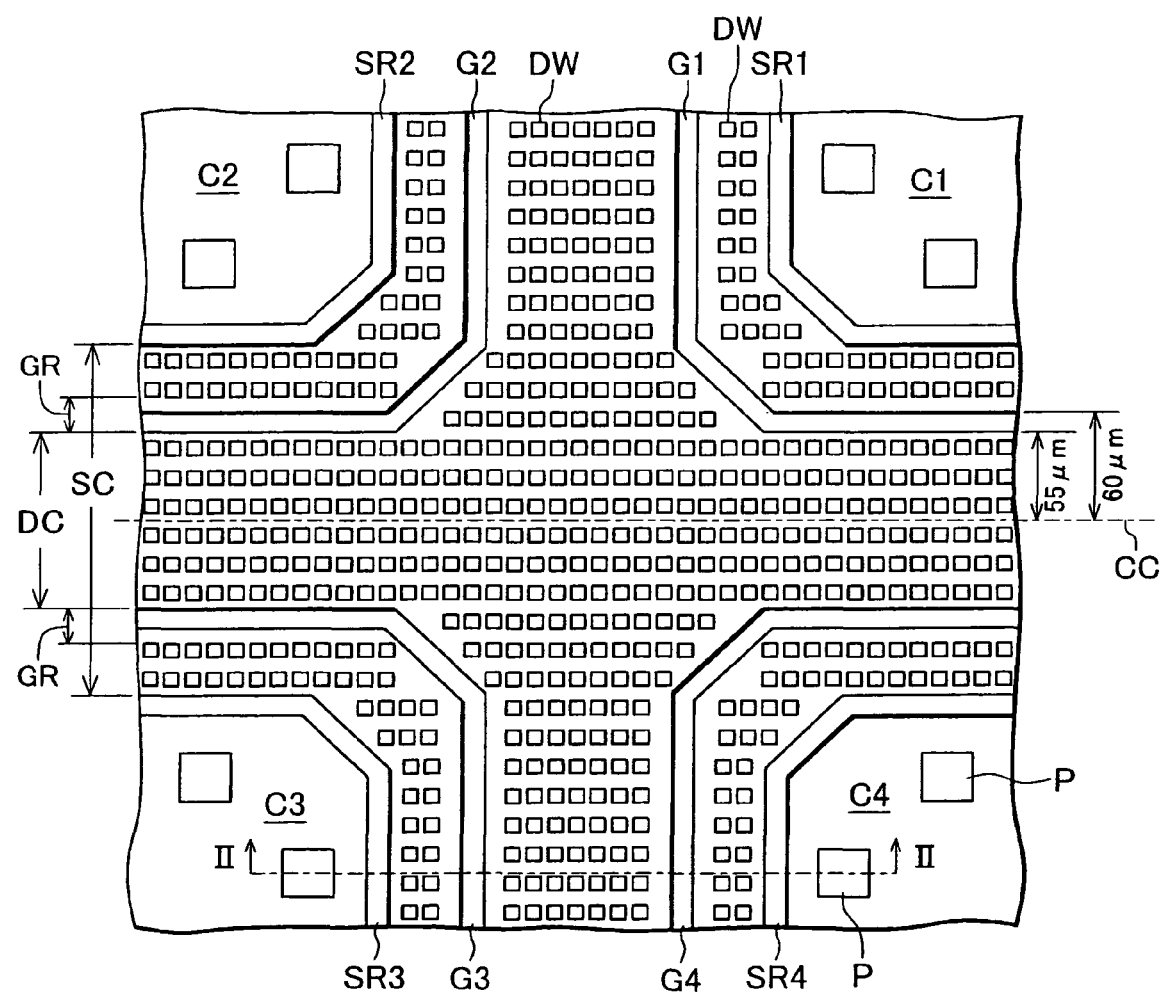
FIG. 1 is a schematic plan view of a semiconductor wafer according to an embodiment of the present invention.

FIG. 1 is a schematic diagram showing an example of a plan layout of a scribe area of a semiconductor wafer according to an embodiment of the present invention. FIGS. 2A to 2E are cross sectional views taken along one-dot chain line II-II shown in FIG. 1, illustrating main processes of a semiconductor device fabrication method for forming the semiconductor wafer shown in FIG. 1 and dicing it to form semiconductor chips.

Chip areas C1 to C4 are defined in four corners in FIG. 1. Semiconductor integrated circuit structures having a multilayer wiring are formed in the chip areas C1 to C4. A pad P is disposed in a peripheral area of each chip area.

Seal rings SR1 to SR4 for preventing moisture invasion and the like are formed surrounding the outer peripheries of the chip areas C1 to C4. The area outside the seal rings SR1 to SR4 is a scribe area SC. Dummy wirings DW are also disposed in the scribe area SC. Areas having a constant width and formed on both sides of a center line CC of the scribe area are dicing areas DC along which dicing is performed to dice the semiconductor wafer.

A groove forming area GR having a limited width is defined surrounding each chip area C, the groove being formed through the passivation layer. The dummy wirings DW are not disposed in a wiring area where the passivation layer etching reaches, in the groove forming area GR. In this case, in order to suppress degradation of flatness to be caused by non-existence of dummy wirings, the width of the groove forming area is desired to be one third of or narrower than the width of the scribe area.

In the groove forming areas GR, grooves G1 to G4 passing through at least the passivation layer are etched at the same time when the pad window etching process is executed. The width of the groove G is preferably in the range from 0.5 µm to 10 µm. If the groove width is made too narrow, there is a possibility that etching becomes insufficient and a stress cannot be relieved sufficiently. If the groove width is made too broad, the dicing area width is limited and flatness retention may become insufficient.

The groove G is formed in the groove forming area GR outside the dicing area DC, and dicing is performed within the dicing area DC. There is an area with the passivation layer between the chip end plane and the groove after dicing.

For example, if the width of the scribe area SC is 126 µm, the groove forming area GR is formed in the range from 54 µm to 61 µm from the center line CC of the dicing area DC, and the passivation layer and underlying insulating layer are etched in the range from 55 µm to 60 µm from the center line CC to form the grooves G1 to G4. Dicing is performed in the region of a width from 40 to 50 µm relative to the center line CC.

The width of the groove forming area is wider by 1 µm on both sides than that of the groove width, by considering a mask alignment error. If a mask alignment precision is high, this margin may be reduced. The margin width is preferably set to about 0.1 to 5 µm in accordance a mask alignment precision. Dummy wirings DW are disposed on both sides of the groove forming area. The grooves separate at least the passivation layer storing a stress, reduce the thickness of the insulating lamination layer and locally weaken the strength of the insulating lamination layer. Since the passivation layer storing a stress is left in the dicing area, a crack may be formed from the dicing plane during dicing, and a peel-off between the insulating layers may occur. If the crack is formed at the position upper than the groove bottom, it is obvious that the crack is terminated at the groove.

If a crack is formed lower than the groove bottom and extends to the position under the groove, the insulating layers are cleaved from the peel-off plane toward the upper groove to relieve the stress. It may consider that the insulating lamination layer upper than the peel-off plane surrenders to the stress accumulated in the passivation layer and to a locally weakened strength. From this viewpoint, the groove has the function of enhancing the stress release.

As shown in FIG. 1, it is preferable to cut the corners of the seal ring SR in the corners of the rectangular chip area and to cut correspondingly the corners of the groove forming area and groove. In this case, the above-described numerical value ranges are not satisfied in the corners.

Since dicing is performed along approximately perpendicular two directions, the chip corner is subjected to the influence of the dicing twice. If the corner is approximately a right angle, two impact forces may form a crack from the corner to the inside of the circuit area because of stress concentration, even if the groove is formed. By making the groove have a plan shape with the corners being cut off, stress concentration can be avoided and a crack can be more effectively blocked.

Description will be made on main processes of a semiconductor device fabrication method by taking as an example a semiconductor device having a three-layer (excluding a pad layer) multilayer wiring structure.

A scribe area SC and chip areas C3 and C4 on both sides of the scribe area are defined in a silicon substrate 10 shown in FIG. 2A. A dicing area DC and groove forming area GR are defined in the scribe area SC. Although the scribe areas with dummy wirings are left outside of the groove forming regions GR, the groove forming regions GR may extend to the outer peripheries of the scribe regions if the requirements of flatness are small. After an element isolation region and semiconductor elements are formed on the surface of the silicon substrate 10, they are covered with an insulating layer 21 such as a silicon oxide film. After a lead conductive plug is formed, an etch stopper layer ES1 is formed on the insulating layer 21, having an oxygen shielding function and a copper diffusion preventive function. An interlayer insulating film IL1 is formed on the etch stopper layer ES1. Wiring trenches and via holes are formed through the interlayer insulating film IL1 and etch stopper layer ES1, and a first wiring layer including first wirings W1 and dummy wirings DW1 is formed by a damascene process. The process of forming a damascene wiring will be later described.

Similarly, an etch stopper layer ES2 having the copper diffusion preventive function is formed covering the first wirings, and an interlayer insulating film IL2 is formed on the etch stopper layer ES2. A damascene concave portion is formed, and a second wiring layer including second wirings W2 and second dummy wirings DW2 is buried in the damascene concave portion. A third etch stopper layer ES3 and a third interlayer insulating layer IL3 are formed and a damascene concave portion is formed to bury a third wiring layer including third wirings W3 and third dummy wirings DW3 in the damascene concave portion.

FIGS. 3A to 3F are cross sectional views illustrating an example of a dual damascene process.

Figure 3A:
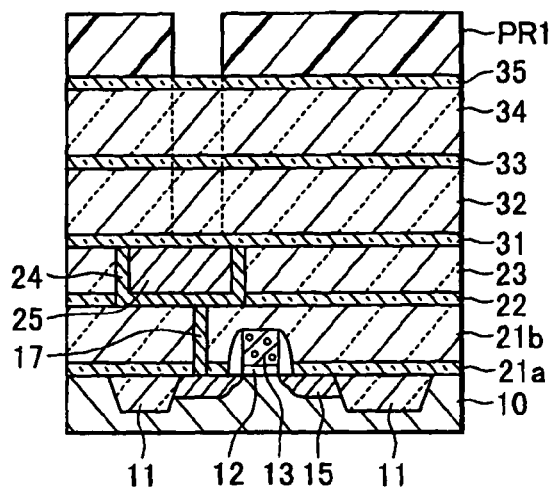
FIGS. 3A to 3I are cross sectional views illustrating the details of a process of forming wirings shown in FIG. 2A.

As shown in FIG. 3A, on a surface of a silicon substrate 10, an element isolation region 11 is formed by STI to define active regions. A gate insulating film 12 is formed on the surface of the active regions by thermal oxidation. A gate electrode 13 of polysilicon or polycide is formed on the gate insulating film. Source/drain regions 15 are formed on both sides of the gate electrode 13 to form a MOS transistor structure. An insulating layer 21 is formed covering the gate electrode, the insulating layer being a lamination of a silicon nitride layer 21a and a silicon oxide layer 21b. A conductive plug 17 is formed through the insulating layer 21, reaching a MOS transistor electrode.

A lamination layer is formed covering the conductive plug 17 and insulating layer 21, the lamination layer being constituted of an etch stopper layer 22 of silicon nitride or the like having the oxygen shielding function and an interlayer insulating film 23 of silicon oxide or the like. A photoresist mask is formed on the lamination layer, and a wiring layer pattern is opened. Necessary regions of the insulating layer 23 and etch stopper layer 22 are removed to form a wiring trench. A barrier metal layer 24 capable of preventing copper diffusion and a plating seed metal (copper) layer are formed by sputtering, and a copper layer 25 is deposited by plating. An unnecessary metal layer on the insulating layer 23 is removed to form a lower level wiring layer.

A silicon nitride layer 31 of 50 nm in thickness, a silicon oxide layer 32 of 300 nm in thickness, a silicon nitride layer 33 of 30 nm in thickness, a silicon oxide layer 34 of 300 nm in thickness and a silicon nitride layer 35 of 50 nm in thickness functioning as an antireflection film are formed by plasma enhanced chemical vapor deposition (PE-CVD), covering the underlying wiring layer. The intermediate silicon nitride layer 33 functions as an etch stopper when the wiring pattern is etched. The dual damascene process may be performed by omitting the intermediate etch stopper layer.

A resist layer is coated on the antireflection silicon nitride layer 35, exposed and developed to form a resist pattern PR1 having an opening corresponding to a via hole. By using the resist pattern as a mask, the antireflection silicon nitride layer 35, silicon oxide layer 34, silicon nitride layer 33 and silicon oxide layer 32 are etched. The resist pattern PR1 is thereafter removed.

Figure 3B:
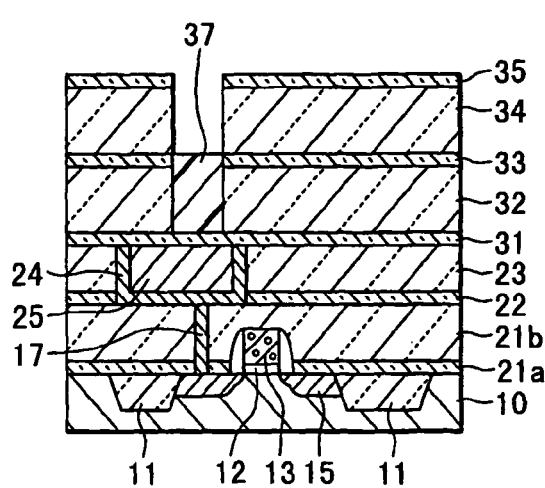

As shown in FIG. 3B, resin 37 is buried in the via hole, the resin having a similar composition to that of the resist pattern and not having photosensitivity. The resin is etched back by oxygen plasma to let it have a predetermined height. For example, the resin has an intermediate height between the upper silicon oxide layer 34 and the lower silicon oxide layer 32.

Figure 3C:
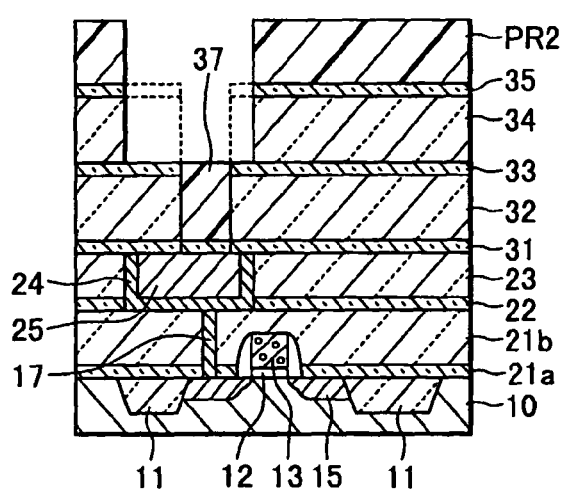

As shown in FIG. 3C, a resist pattern PR2 is formed on the antireflection silicon nitride layer 35, having an opening corresponding to a wiring trench. By using the resist pattern PR2 as a mask, the silicon nitride layer 35 and silicon oxide layer 34 are etched. During this etching, the silicon nitride layer 33 functions as an etch stopper. The inside of the via hole is protected by the resin filler 37. Thereafter, ashing is performed by plasma of $O_2$ and $CF_4$ to remove the resist pattern PR2 and the organic resin filler 37.

Figure 3D:
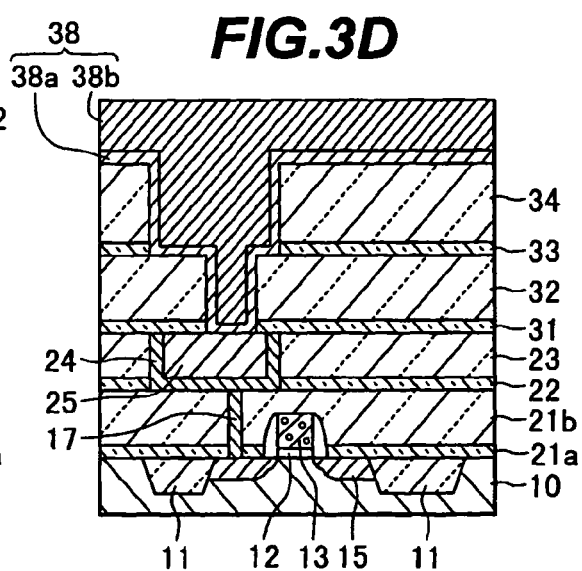

As shown in FIG. 3D, the silicon nitride layer 33 exposed on the bottom of the wiring trench and the silicon nitride layer 31 exposed on the bottom of the via hole are etched to expose the surface of the lower level wiring. The antireflection silicon nitride layer 35 is also removed by this etching. In this case, a pre-process such as annealing may be performed by using Ar sputtering, $H_2$ plasma and an $H_2$ atmosphere to perform a reduction process for the exposed lower level wiring surface and remove a natural oxide film (including chemical oxide) if any.

As shown in FIG. 3D, for example, a Ta layer 38a of 25 nm in thickness and a seed Cu layer of 100 nm in thickness are formed by sputtering. A Cu layer 38b having a sufficient thickness is formed by electroplating on the seed layer.

Figure 3E:
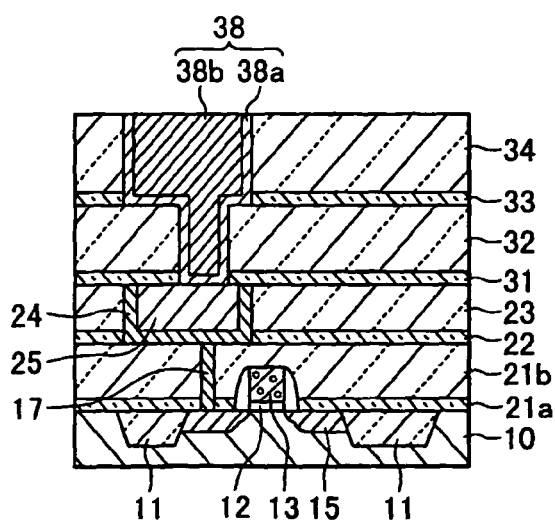

As shown in FIG. 3E, the metal layer on the silicon nitride layer 35 is removed by CMP to obtain a Cu wiring 38 made of the Ta layer 38a and Cu layer 38b. Similar processes are repeated to form multilayer wirings. In this specification, a Cu alloy layer containing additive is also called a CU layer, and an Al alloy layer containing additive is also called an Al layer.

Reverting to FIG. 2A, a fourth etch stopper layer ES4 and a fourth interlayer insulating film IL4 are formed on the third wiring layer W3, a via hole is formed and a via conductor TV is buried in the via hole. On the fourth interlayer insulating film IL4, an uppermost Al wiring layer connected to the via conductor is formed. The Al wiring layer is patterned to form pads P and seal rings SR. Since flatness requirements are small at the level higher than the uppermost Al wiring layer, dummy wirings are not necessary to be disposed in the uppermost Al wiring layer. This process will be described in detail.

FIGS. 3F to 3I are schematic diagrams illustrating a process of forming the uppermost wiring layer.

Figure 3F:
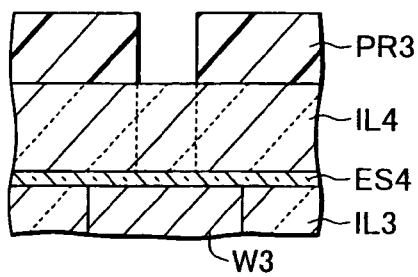

As shown in FIG. 3F, on the third copper wiring layer W3, the fourth etch stopper layer ES4 and fourth interlayer insulating film IL4 are formed by PE-CVD. The fourth etch stopper layer has a thickness of 70 nm and is made of a silicon nitride layer, and the force interlayer insulating film has a thickness of 600 nm and is made of a silicon oxide layer. A resist pattern PR3 is formed having an opening corresponding to a via pattern, and the fourth interlayer insulating film IL4 having a thickness of 600 nm is etched. During this etching, the etch stopper layer ES4 functions as an etch stopper. The resist pattern PR3 is thereafter removed by ashing.

Figure 3G:
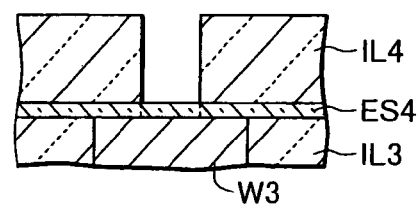

As shown in FIG. 3G, by using the fourth interlayer insulating film IL4 formed with a via hole as a mask, the underlying etch stopper layer ES4 made of silicon nitride is etched. The surface of the lower level wiring W3 is therefore exposed.

Figure 3H:
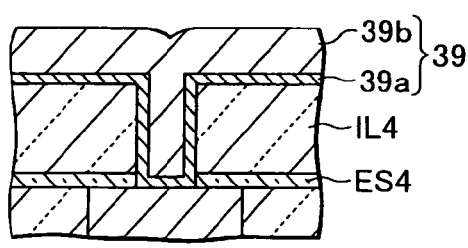

As shown in FIG. 3H, after the exposed surface of the lower level wiring is processed by Ar sputtering, a TiN layer 39a is formed to a thickness of 50 nm by sputtering or the like. A W layer 39b having a thickness of 300 nm is formed on the TiN layer 39a by CVD to bury the via hole. Thereafter, the W layer 39b and TiN layer 39a on the surface of the interlayer insulating film IL4 are removed by CMP. A via conductor buried in the via hole is therefore formed.

Figure 3I:
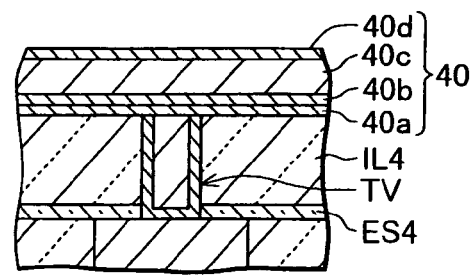

As shown in FIG. 3I, a Ti layer 40a of 40 nm in thickness, a TiN layer 40b of 30 nm in thickness, an Al layer 40c of 1 μm in thickness and a Ti layer 40d of 50 nm in thickness are laminated by sputtering. A resist pattern is formed on this laminated aluminum wiring layer and etching is performed to form the uppermost wiring pattern having a desired shape.

Since the uppermost wiring layer is made of aluminum, the surface of the pad is aluminum which is suitable for wire bonding and the like.

Reverting to FIG. 2A, after the uppermost wiring layer is formed, a high density plasma (HDP) silicon oxide layer IS of 1400 nm in thickness and a silicon nitride layer PS of 500 nm in thickness are formed on the uppermost wiring layer, as a cover layer. The silicon nitride layer is used as a passivation film having moisture resistance.

As shown in FIG. 2B, a resist layer PR4 is coated on the passivation layer PS, exposed and developed to open windows PW for the pads and windows GW for grooves. By using the resist pattern PR4 as a mask, the passivation layer PS and insulating layer IS are etched, and the TiN layer on the pad surface is also etched. The pad having aluminum surface is therefore exposed.

In the scribe area, after the passivation layer PS and interlayer insulating film IS are etched, the underlying fourth interlayer insulating film IL4, etch stopper layer ES4 and third interlayer insulating film IL3 are also etched. Depending upon an over-etch degree, the etching progresses to a deeper level. Dummy wirings are not disposed in the area etched by this etching. In the state shown, although the layers down to the third interlayer insulating film IL3 are etched, the underlying second wiring layer is not exposed. FIG. 2C shows the state that after the etching, the resist pattern PR4 is removed. The surface TiN layer is removed, the pads have an aluminum surface with the surface TiN layer being removed, and the groove G surrounds each chip area and positions in the scribe area SC outside of the dicing area DC. Dummy wirings are not disposed at least in an area of the wiring layer in the groove forming region, the area being subjected to etching. Therefore, dummy wirings will not be blown and scattered during etching the groove G. By dicing an area dc in the dicing area DC, chips are separated.

As shown in FIG. 2D, the whole thickness of the area dc in the dicing area DC is diced to separate chips. Although peel-off of insulating layers may occur from the dicing plane, this peel-off can be prevented from entering the circuit area.

Figure 2E:
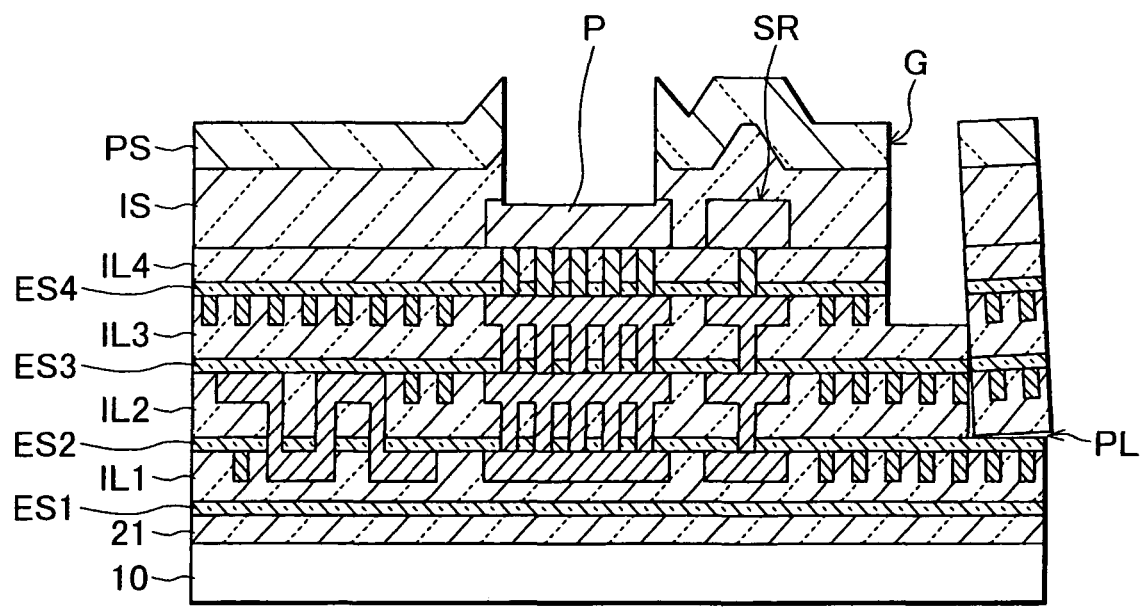

As shown in FIG. 2E, if a peel-off occurs at the interface PL between insulating layers due to an impact force during the dicing process and the peel-off reaches under the groove G, a crack is formed toward the groove G so that the peel-off will not enter the inner side.

As described above, while a peel-off during the dicing process can be prevented, blow and scatter of dummy wirings during the cover layer etching can be prevented. The wiring layers not disposed with dummy wirings in the groove forming area can be limited to the uppermost wiring layer and a nearby wiring layer. Therefore, the lower level wiring layers can be disposed with dummy wirings in the whole scribe area. The width of the groove forming area is limited also in the wiring layer not disposed with dummy wirings in the groove forming area, so that the degraded flatness can be made negligible by disposing dummy wirings in the area other than the groove forming area.

Although it is preferable to form a pad having an aluminum surface if wire bonding is performed, the uppermost aluminum wiring layer is not necessary if assembly is performed by using bumps. In this case, copper wiring layers are used for all wiring layers, and it is preferable to form dummy wirings also in the uppermost wiring layer.

FIGS. 4A and 4B are diagrams showing an embodiment which does not use an aluminum wiring layer.

As shown in FIG. 4A, the layers down to the third wiring layer W3 are formed on a silicon substrate in the manner similar to the above-described embodiment.

As a cover layer, a silicon nitride layer 43 of 50 nm in thickness, a PE-CVD silicon oxide layer IS of 400 nm in thickness and a silicon nitride layer PS of 500 nm in thickness are formed. On the silicon nitride passivation layer PS, a resist pattern PR5 is formed having pad windows PW and stress release groove windows GW. By using the resist pattern PR5 as a mask, the passivation layer PS and insulating layer IS are etched. The resist pattern PR5 is thereafter removed. By using the passivation layer PS and insulating layer IS as a mask, the silicon nitride layer 43 is etched.

As shown in FIG. 4B, the pad P in the third wiring layer is exposed. In the groove G, the layers down to the third interlayer insulating film IL3 of the third wring layer are etched by over-etching. If dummy wirings are disposed in the area where etching progresses, dummy wirings are blown and scattered. This blow and scatter of dummy wirings can be prevented by not disposing dummy wirings in the groove forming area, down to the depth where etching can reach.

In the above-described embodiments, pad windows and groove windows are formed at the same time by limiting the area where dummy wirings are formed. Blow and scatter of dummy wirings may be prevented by selective etching or control etching. If there are other etching processes or the like, the groove may be formed by an etching process different from the etching process for pad windows. In this case, dummy wirings may be formed in the whole scribe area including an area under the groove.

FIG. 5 is a plan view of a semiconductor wafer according to another embodiment of the present invention. In this embodiment, dummy wirings DW are disposed in the whole scribe area SC. The bottoms of grooves G1 to G4 are at a level higher than the dummy wirings DW. Therefore, the dummy wirings will not be blown and scattered even if the grooves G1 to G4 overlap the dummy wirings DW.

Other points are similar to those of the semiconductor wafer shown in FIG. 1. However, since the dummy wirings DW are disposed also under the grooves G1 to G4, the restrictions of the widths and the like of the grooves G1 to G4 can be relieved.

FIGS. 6A and 6B, FIGS. 7A and 7B and FIGS. 8A and 8B are schematic cross sectional views illustrating three fabrication methods realizing the structure shown in FIG. 5.

FIG. 6A illustrates a process corresponding to the process of FIG. 2A. Dummy wirings DW are disposed also under the groove forming area GR.

On the passivation layer PS, a resist pattern is formed having pad opening windows and groove forming windows (as shown in FIG. 2B), and the passivation layer PS and the uppermost insulating layer IS are etched. When the passivation layer PS and uppermost insulating layer IS above the pad P are etched, the passivation layer PS and uppermost insulating layer IS above the groove are also etched to approximately the same depth. If over-etch is performed, the underlying fourth interlayer insulating film IL4 is etched. In this etching, if etching gas having a high etching selectivity between silicon nitride and silicon oxide is used, even if the fourth interlayer insulating film IL4 is etched, the underlying fourth etch stopper layer ES4 is hardly etched. Therefore, the dummy wrings DW3 disposed under the fourth etch stopper layer ES4 will not be exposed, blown and scattered.

FIG. 6B shows the state that the photoresist pattern on the passivation layer PS is removed. Pads P are opened and grooves G extend from the surface of the passivation layer PS to the surface of the fourth etch stopper layer ES4 via the uppermost insulating layer IS and fourth interlayer insulating film IL4. Most of the fourth etch stopper layer ES4 is left and the dummy wirings DW3 are not exposed.

As an example of etching gas having a high etching selectivity, after silicon nitride of the passivation layer PS is etched by etching gas mainly containing $CF_4$, etching gas of $CF_4$ mixed with $CHF_4$ is used. By raising a mixture ratio, the etching rate of silicon nitride can be set lower than that of silicon oxide.

FIGS. 7A and 7B are schematic cross sectional views illustrating another fabrication method realizing the structure shown in FIG. 5.

As shown in FIG. 7A, in forming the lamination structure similar to that shown in FIG. 2A, after the uppermost insulating layer IS is formed, the surface thereof is planarized by CMP or the like. A thickness of the uppermost insulating layer IS above the pad P becomes definitely thinner than that in the groove forming area GR. A passivation layer PS is formed on the planarized uppermost insulating layer IS.

As shown in FIG. 7B, on the passivation layer PS, a photoresist pattern PR4 is formed having pad opening windows and groove forming windows, and the passivation layer PS and uppermost insulating layer IS are etched. Since the passivation layer PS has generally the same thickness over the whole area, etching the passivation layer above the pads P and grooves G is completed generally at the same time. As the etching of the uppermost insulating layer IS starts, etching of the uppermost insulating layer IS on the pad P is completed when the uppermost insulating layer IS is still left under the groove G because the uppermost insulating layer IS on the pad P is thin. By performing a control etching whose etching time is controlled, the groove G can be stayed on the uppermost insulating layer even if an over-etch is performed. The over-etch may be performed for a longer time to etch the uppermost insulating layer IS and underlying fourth interlayer insulating film IL4. Etching gas having a high etching selectivity between silicon oxide and silicon nitride may be used. The effects of the groove G can be expected if it extends at least through the passivation layer PS.

Etching to be performed after the passivation layer PS is formed is not necessarily the pad opening etching. If there is an etching process independent from the pad opening etching, this etching process may be used for forming the groove. A groove etching process may be prepared independently.

Figure 8A:
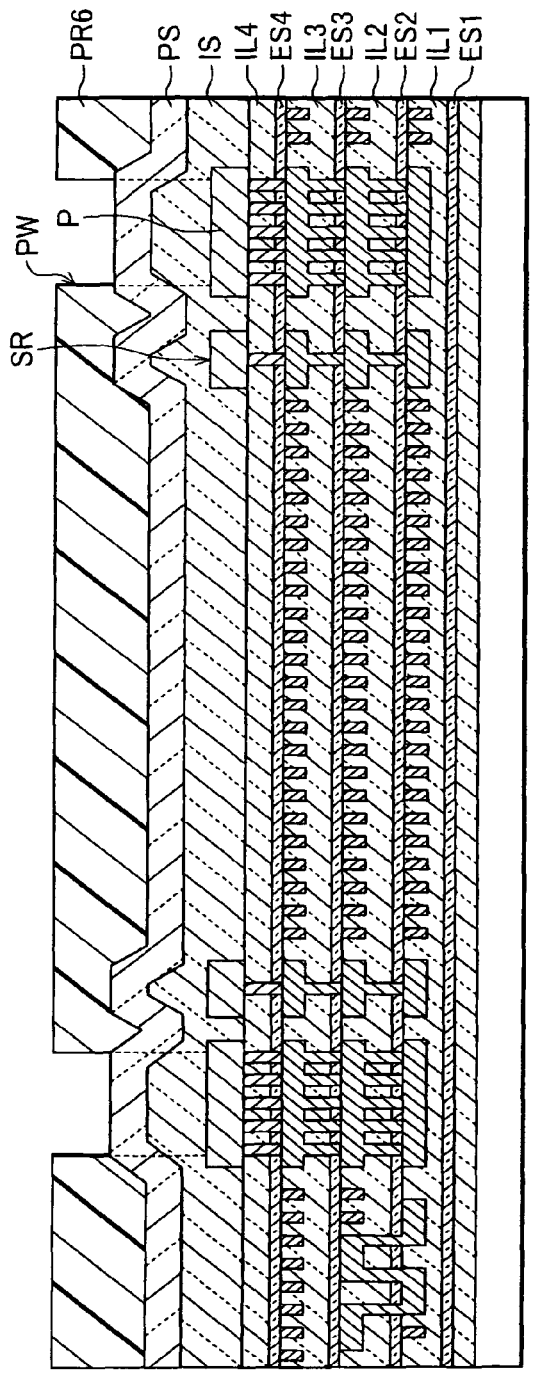
FIGS. 8A and 8B are cross sectional views illustrating main processes of another semiconductor device fabrication method according to the embodiment shown in FIG. 5.

FIG. 8A illustrates a pad window etching process. After the uppermost insulating layer IS and passivation layer PS are formed, a photoresist pattern PR6 is formed having an opening corresponding to the pads. By using the photoresist pattern PR6 as an etching mask, the passivation layer PS and uppermost insulating layer IS on the pad are etched. After the pad is opened, the photoresist pattern PR6 is removed.

Figure 8B:
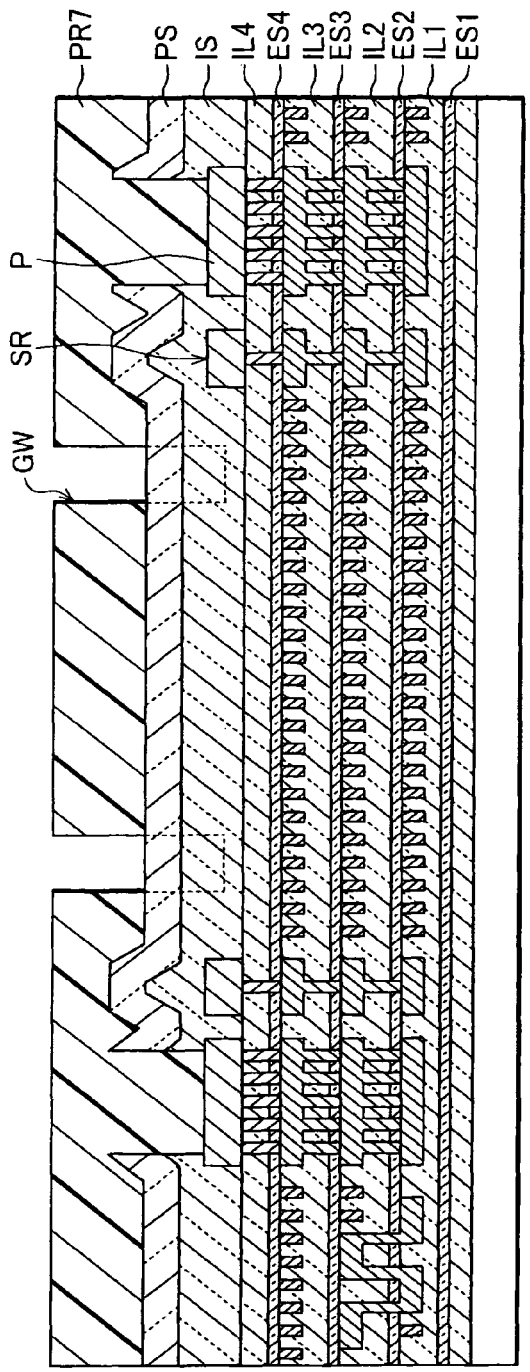

As shown in FIG. 8B, for another etching process, a photoresist pattern PR7 is formed having an opening corresponding to a groove forming window GW. In this etching process, at least the passivation layer PS is etched through the opening GW. Since the pad P was already opened, this etching process can be performed under the conditions independent from the pad opening conditions.

With these methods, the grooves G1 to G4 can be selectively formed in the scribe area even if dummy wirings are disposed in the whole scribe area SC.

If a copper multilayer wiring is formed and then a pad forming aluminum wiring layer is formed, flatness of the uppermost copper wiring layer is not required severely. Therefore, dummy wirings in the uppermost copper wiring layer may be omitted in some cases.

Figure 9:
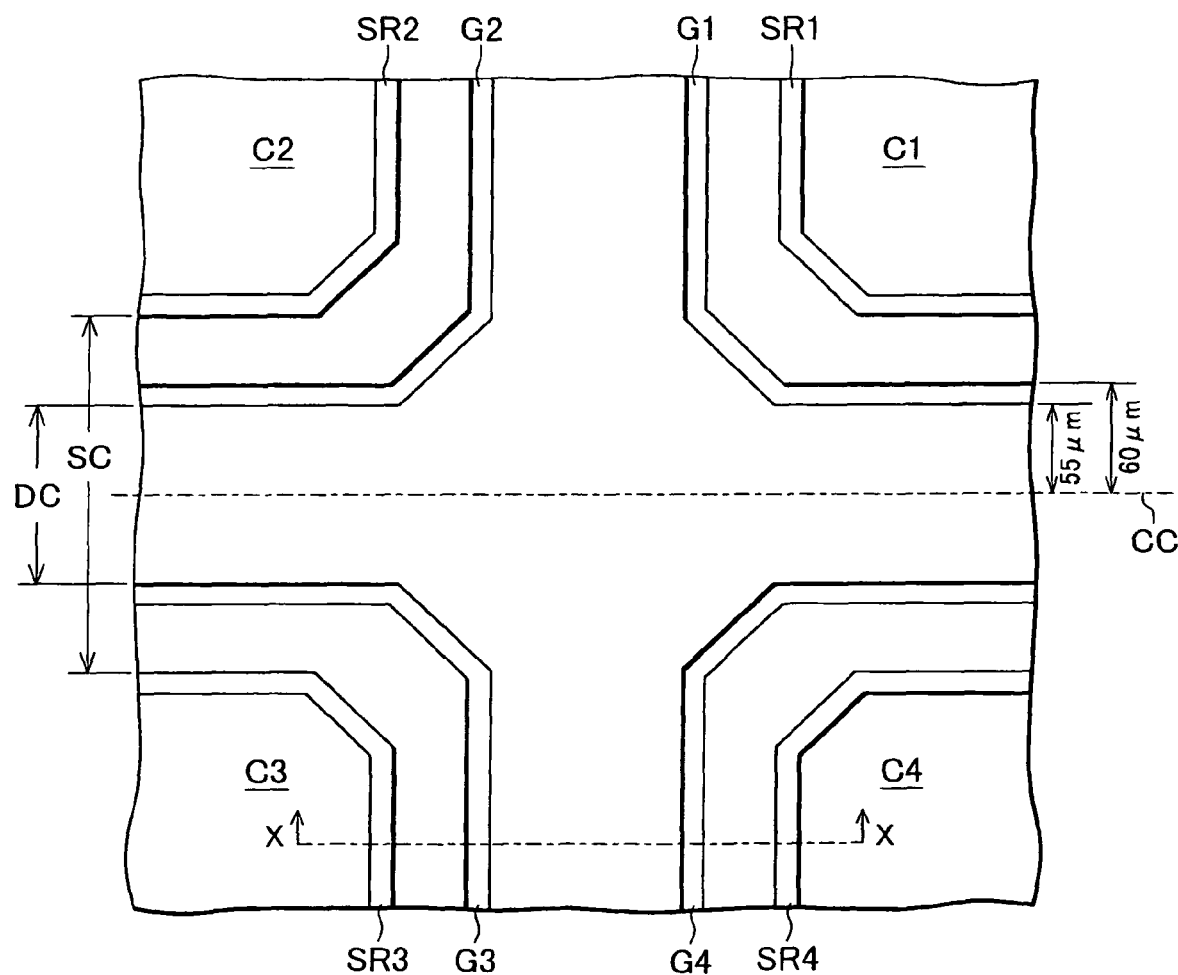
FIG. 9 is a schematic plan view of a semiconductor wafer according to another embodiment of the present invention.

FIG. 9 is a plan view of a semiconductor wafer in which dummy wirings are not disposed in the uppermost copper wiring layer in the scribe area SC. Dummy wirings may be disposed in each chip area inner than the seal ring SR.

FIGS. 10A and 10B are cross sectional views taken along one-dot chain line X-X shown in FIG. 9.

FIG. 10A is a cross sectional view corresponding to that shown in FIG. 2A. Although the dummy wirings DW3 and wirings W3 are formed in the third wiring layer, dummy wirings are not formed in the scribe area SC. Other points are similar to those of FIG. 2A.

Pads are thereafter opened by the etching process similar to that shown in FIG. 2B.

FIG. 10B shows the state that after the pad opening etching, the photoresist pattern is removed. The uppermost wring layer IS and passivation layer PS on the pad P are etched to expose the pad surface. The groove G extends through the passivation layer PS, uppermost insulating layer IS, fourth interlayer insulating film IL4 and fourth etch stopper layer ES4 and reaches the third interlayer insulating film IL3. Since dummy wirings are disposed in the third wiring layer in the scribe area, dummy wirings will not be blown and scattered during the groove G etching. Since the dummy wirings are disposed in the chip area, necessary flatness can be retained. Flatness degradation due to omitting the dummy wirings in the third wiring layer in the scribe area can be minimized. If flatness of the chip area is not required severely, the dummy wirings in the third wiring layer may be omitted also in the chip area.

In the above-described embodiments, the groove surrounding each chip area is formed on both sides of the scribe area SC. Namely, two grooves are formed in the scribe area. The number of grooves is not limited to two grooves. The passivation layer in the dicing area may be removed. As the passivation layer in the dicing area is removed, the dicing is simplified.

Figure 11:
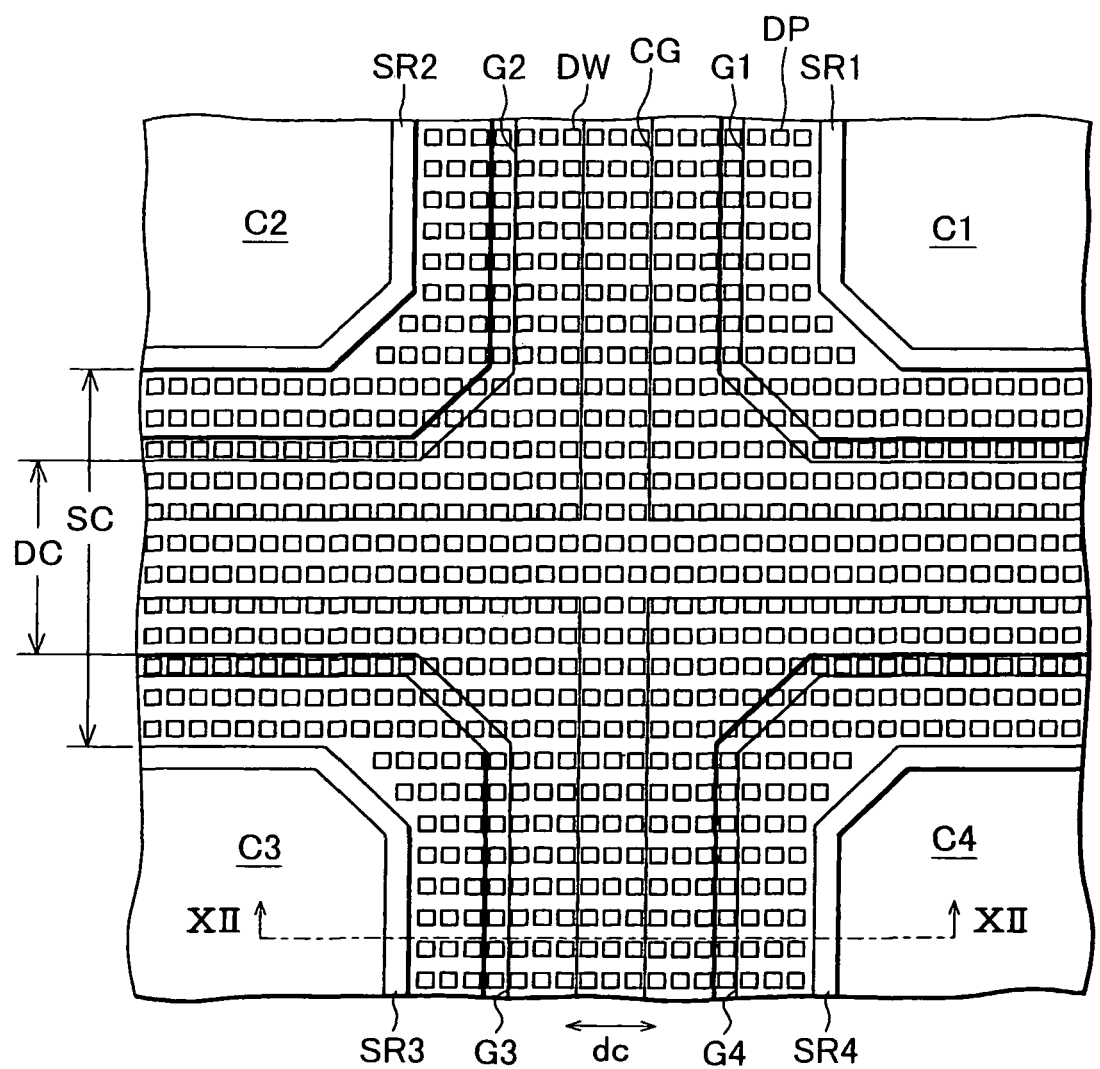
FIG. 11 is a schematic plan view of a semiconductor wafer according to another embodiment of the present invention.

FIG. 11 is a plan view of a semiconductor wafer according to another embodiment in which three grooves are formed in the scribe area. A relatively wide groove CG is formed in the central area of the scribe area SC along the center line. The center groove CG is preferably formed in an area dc to be actually diced. Other points are similar to those shown in FIG. 1.

FIGS. 12A and 12B are cross sectional views taken along one-dot chain line XII-XII shown in FIG. 11.

As shown in FIG. 12A, a photoresist pattern PR8 is formed on a semiconductor wafer having the structure similar to that shown in FIG. 2A. The photoresist pattern PR8 has pad opening windows PW and groove opening windows GW similar to the above-described embodiments, and in addition it has a center groove window CW in the dicing area DC. By using the photoresist pattern PR8 as an etching mask, the insulating layers including the passivation layer PS and uppermost insulating layer IS are etched. This etching is performed in a manner similar to that of the above-described embodiments. For example, selective etching is stopped by using a silicon nitride film as an etch stopper.

FIG. 12B is a cross sectional view showing the state that the photoresist pattern PR8 is removed. Similar to the above-described embodiments, pads P are opened and grooves G are formed. In addition, the center groove CD is formed in the scribe area. By forming the center groove CG, the process of dicing the area dc can be simplified. The state after dicing is similar to that of the above-described embodiments, and the effects similar to those of the above-described embodiments can be expected.

In the above-described embodiments, silicon oxide and silicon nitride are mainly used as the materials of the interlayer insulating film and etch stopper layer, respectively. Insulating material other than silicon oxide may be used as the material of the interlayer insulating film. In semiconductor devices having a multilayer wiring structure among others, parasitic capacitance of the wirings can be lowered by using silicon oxide containing fluorine, silicon oxycarbide SiOC, organic insulating layer or the like having a dielectric constant smaller than that of silicon oxide. Instead of silicon nitride, SiC or the like may by used as the material of the etch stopper layer.

Figure 14:
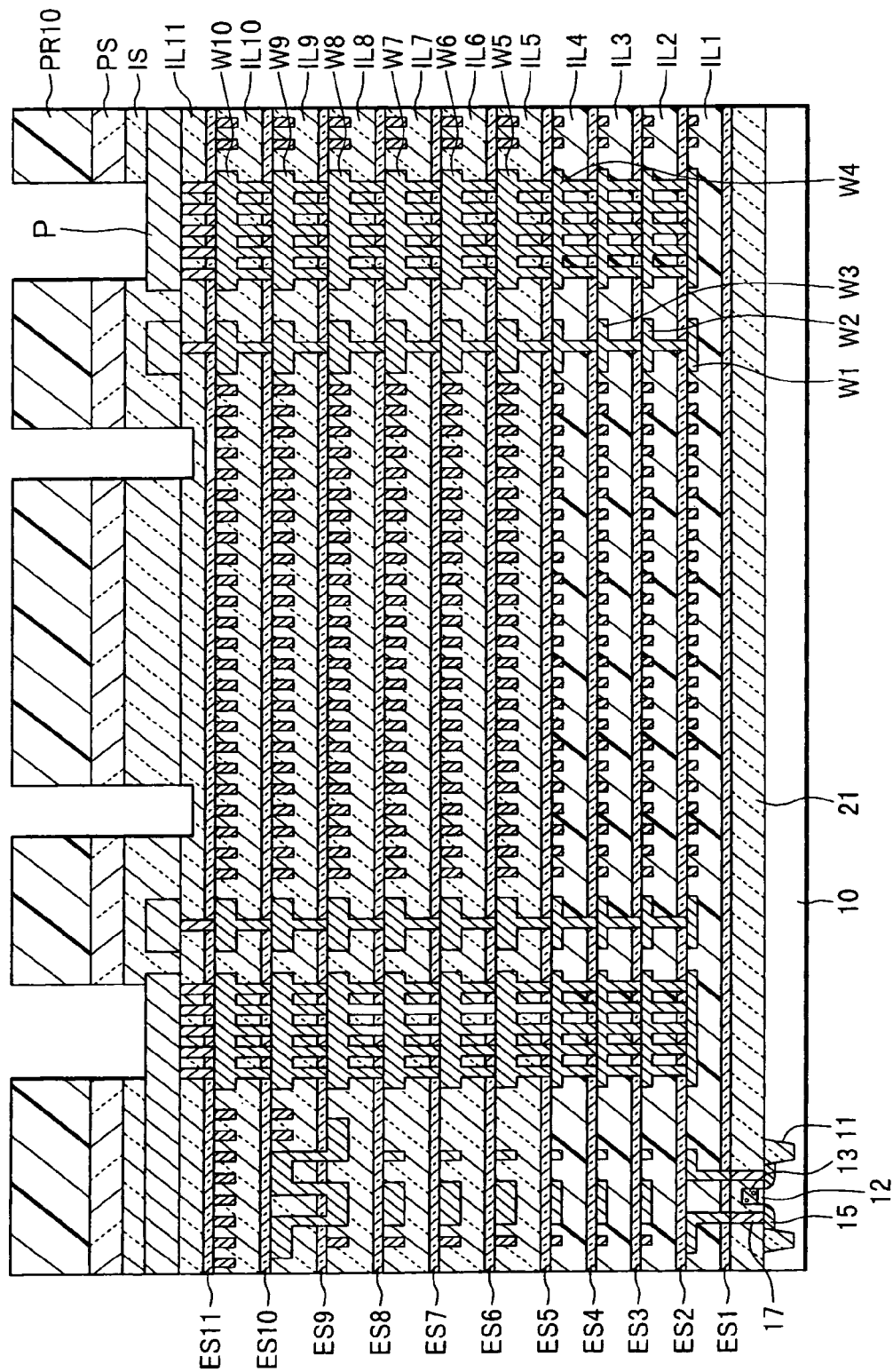
FIG. 14 is a schematic cross sectional view showing the structure of a semiconductor device having ten wiring layers according to a modification of the first embodiment.

FIGS. 13 and 14 are cross sectional views of a semiconductor wafer illustrating a semiconductor device having a multilayer wiring according to another embodiment of the present invention.

As shown in FIG. 13, on the surface of a silicon substrate 10, an element isolation region 11 is formed by STI, and transistors are formed in an active region defined by the element isolation region 11. The transistor structure is constituted of a gate insulating film 12 on the channel region, a gate electrode 13 of polysilicon on the gate insulating film, source/drain regions 15 and the like. An insulating layer 21 of silicon oxide is formed covering he gate electrode, and conductive plugs 17 of W or the like are formed reaching the source/drain regions and the like.

On the surface of the insulating layer, an etch stopper layer ES1 having the oxygen shielding function and a first interlayer insulating film IL1 are formed. A first wiring layer forming concave portion is formed through the first interlayer insulating film IL1 and etch stopper layer ES1, and a first wiring layer W1 of a copper wiring is buried in the concave portion.

On the first wiring layer W1, a second etch stopper layer ES2 and a second interlayer insulating film IL2 are formed and a second copper wiring layer W2 is buried. On the second wiring layer W2, a third etch stopper layer ES3 and a third interlayer insulating film IL3 are formed and a third copper wiring layer W3 is buried. On the third wiring layer W3, a fourth etch stopper layer ES4 and a fourth interlayer insulating film IL4 are formed and a fourth copper wiring layer W4 is buried. The interlayer insulating films accommodating the first to fourth wiring layers are made of organic insulating layers of SiLK or the like.

FIGS. 19A to 19E are cross sectional views illustrating an example of a dual damascene process for forming a damascene wiring in an organic insulating layer.

Figure 19A:
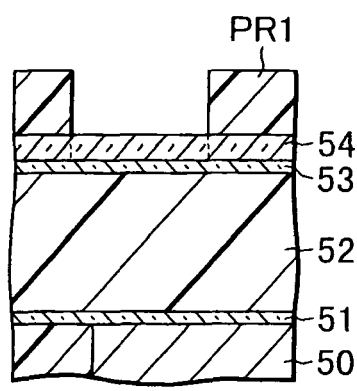
FIGS. 19A to 19E are schematic cross sectional views illustrating a process of forming a damascene wiring in an organic insulating layer shown in FIG. 5.

As shown in FIG. 19A, after a lower level wiring layer 50 is formed, the surface thereof is covered with a copper diffusion preventive layer 51. The copper diffusion preventive layer is made of SiN or SiC and has the etch stopper and oxygen shielding function. For example, an SiC layer 51 having a thickness of 30 nm is formed. On the SiC layer 51, SiLK is spin-coated and cured for 30 minutes at 400° C. to form a SiLK layer 52 having a thickness of 450 nm. On the SiLK layer 52, an SiC layer 53 having a thickness of 50 nm is formed by PE-CVD and a silicon oxide layer 54 having a thickness of 100 nm is formed on the SiC layer by PE-CVD.

On the silicon oxide 54, a resist pattern PR1 having a wiring trench opening is formed and the silicon oxide layer 54 is etched. A wiring trench pattern is therefore transferred to the silicon oxide layer 54. The resist pattern PR1 is thereafter removed.

Figure 19B:
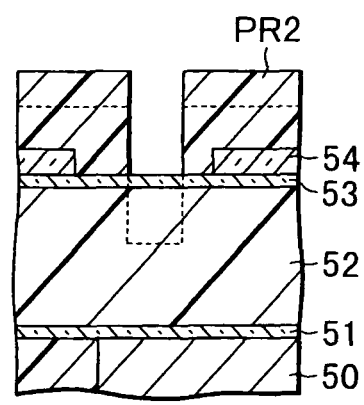

As shown in FIG. 19B, a resist pattern PR2 having a via hole forming opening is formed. By using the resist pattern PR2 as a mask, the SiC layer 53 is etched. Next, etching with plasma containing oxygen is performed to ash the resist pattern PR2 and etch the SiLK layer to an intermediate depth. The resist pattern PR2 is therefore removed.

Figure 19C:
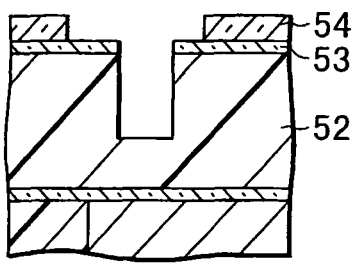

As shown in FIG. 19C, by using the silicon oxide layer 54 as a hard mask, the underlying exposed SiC layer 53 is etched. The silicon oxide layer 54 and SiC layer 53 constitute a hard mask.

Figure 19D:
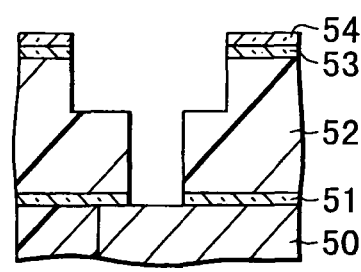

As shown in FIG. 19D, by using the silicon oxide layer 54 and SiC layer 53 as a mask, the SiLK layer 52 is etched. During this etching, the SiLK layer 52 on the bottom of the via hole is also etched to expose the SiC layer 51. For example, the SiLK layer 52 is etched to a depth of 200 nm to form the wiring trench, and then the SiC layer 51 exposed on the bottom of the via hole is etched to expose the surface of the lower level wiring.

Figure 19E:
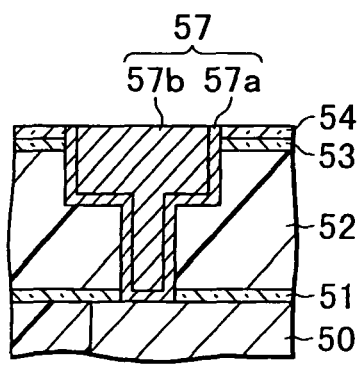

As shown in FIG. 19E, a Ta layer 57a having a thickness of 25 nm is formed by sputtering, and a seed copper layer is formed on the Ta layer to a thickness of about 100 nm by sputtering. When the lower level wiring layer 50 is exposed, a pre-process may be performed by using Ar sputtering, $H_2$ plasma, $H_2$ atmosphere and the like to remove a natural oxide film on the surface of the lower level copper wiring layer 50. On the seed Cu layer, a Cu layer is formed by electroplating. The Cu layer is therefore buried in the wiring trench. Thereafter, CMP is performed to remove an unnecessary metal layer on the surface of the silicon oxide layer 54. Even if the silicon oxide layer 54 is removed by CMP, no practical problem occurs.

Reverting to FIG. 13, an etch stopper layer ES5 and an interlayer insulating film IL5 are formed on the fourth wiring layer, a wiring trench and a via hole are formed and a wiring layer W5 is buried therein. Similarly, on the wiring layer W5, a sixth wiring structure is formed being constituted of an etch stopper layer ES6, an interlayer insulating film IL6 and a wiring layer W6. A seventh wiring structure is formed being constituted of an etch stopper layer ES7, an interlayer insulating film IL7 and a wiring layer W7, and an eighth wiring structure is formed being constituted of an etch stopper layer ES8, an interlayer insulating film IL8 and a wiring layer W8. The interlayer insulating films IL5 to IL8 accommodating the fifth to eighth wiring layers are made of SiOC.

On the eighth wiring layer, a ninth wiring structure is formed being constituted of an etch stopper layer ES9, an interlayer insulating film IL9 and a wiring layer W9, and on the ninth wiring structure, a tenth wiring structure is formed being constituted of an etch stopper layer ES10, an interlayer insulating film IL10 and a wiring layer W10. The interlayer insulating films IL9 and IL10 accommodating the ninth and tenth wiring layers are made of an undoped silicon oxide layer (USG).

On the tenth wiring layer, an etch stopper layer ES11 and an interlayer insulating film IL11 are formed and a via conductor TV similar to that of the above-described embodiments is formed. Thereafter, on the interlayer insulating film, an uppermost aluminum wiring layer constituting pads P and seal rings SR is formed. An insulating layer IS of silicon oxide or the like is formed covering the uppermost wiring layer, and planarized, and a passivation layer PS of silicon nitride or silicon oxynitride is formed on the planarized surface in a manner similar to that of the above-described embodiments.

As shown in FIG. 14, a photoresist layer PR10 is formed on the passivation layer PS, and openings for pads P and grooves are formed. By using the photoresist pattern PR10 as a mask, the passivation layer PS and uppermost insulating layer IS are etched. A pad window is formed on the pad by etching the passivation layer PS and insulating layer IS, and a groove G reaching the eleventh interlayer insulating film IL11 is formed by control etching or selective etching, at the same time when the pad window is formed.

The etching stopper layer ES11 is left unetched on the dummy wirings in the tenth wiring layer W10 so that the dummy wirings will not be blown and scattered.

Figure 15:
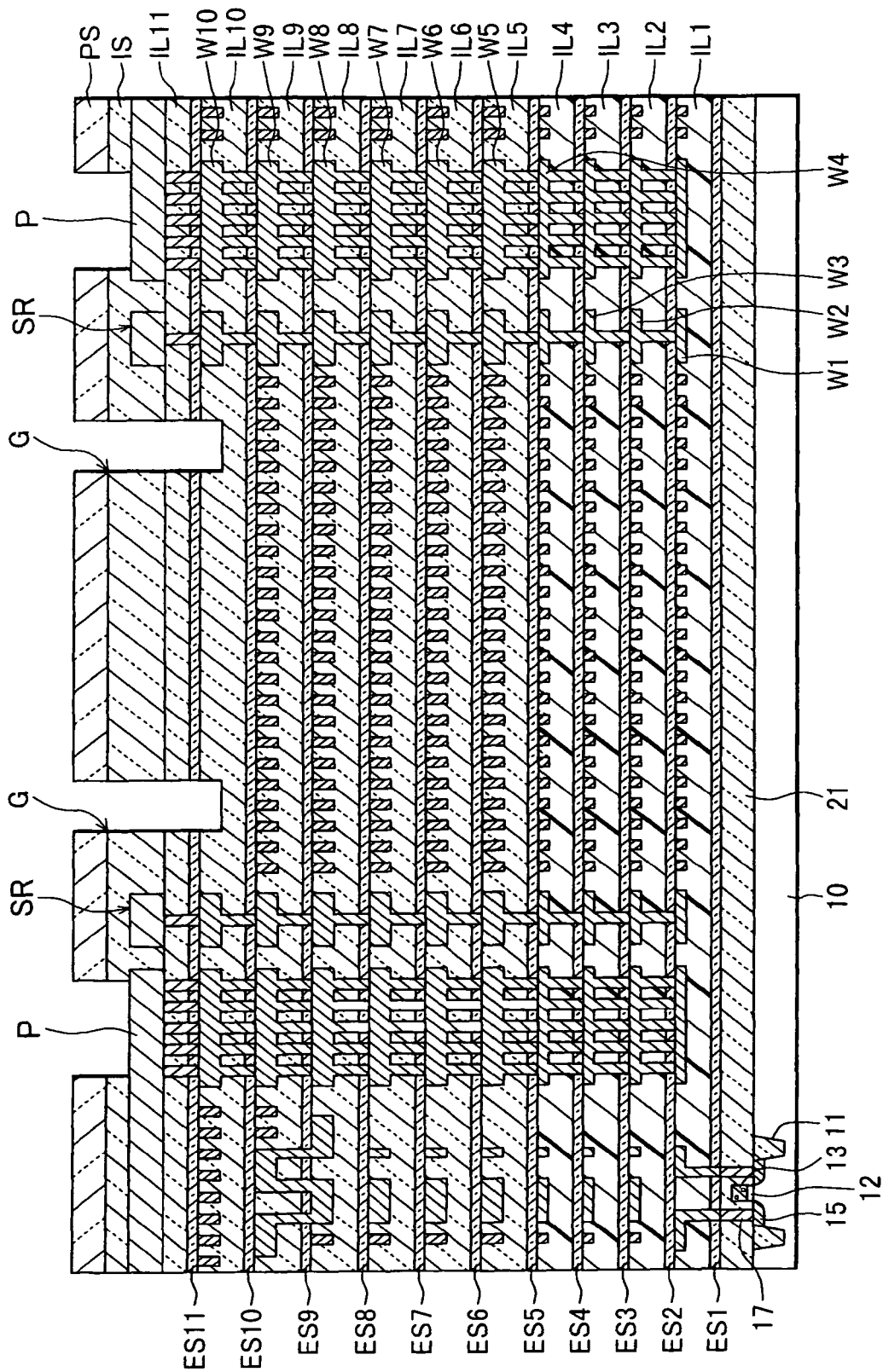
FIG. 15 is a schematic cross sectional view showing the structure of a semiconductor device having ten wiring layers according to a second embodiment.

FIG. 15 shows the structure that dummy wirings are not formed in the uppermost copper wiring in the dicing area. Dummy wirings are not formed in the tenth wiring layer W10 in the scribe area SC. During the etching for the pad P window and groove G window, although the groove G enters the tenth interlayer insulating layer IL10, dummy wirings will not be blown and scattered because dummy wirings are not formed in the tenth wiring layer. Although the dummy wirings are not formed in the tenth wiring layer in the scribe area, the adverse effects of not forming the dummy wirings can be suppressed minimum because the number of upper level wiring layers is small.

Figure 16:
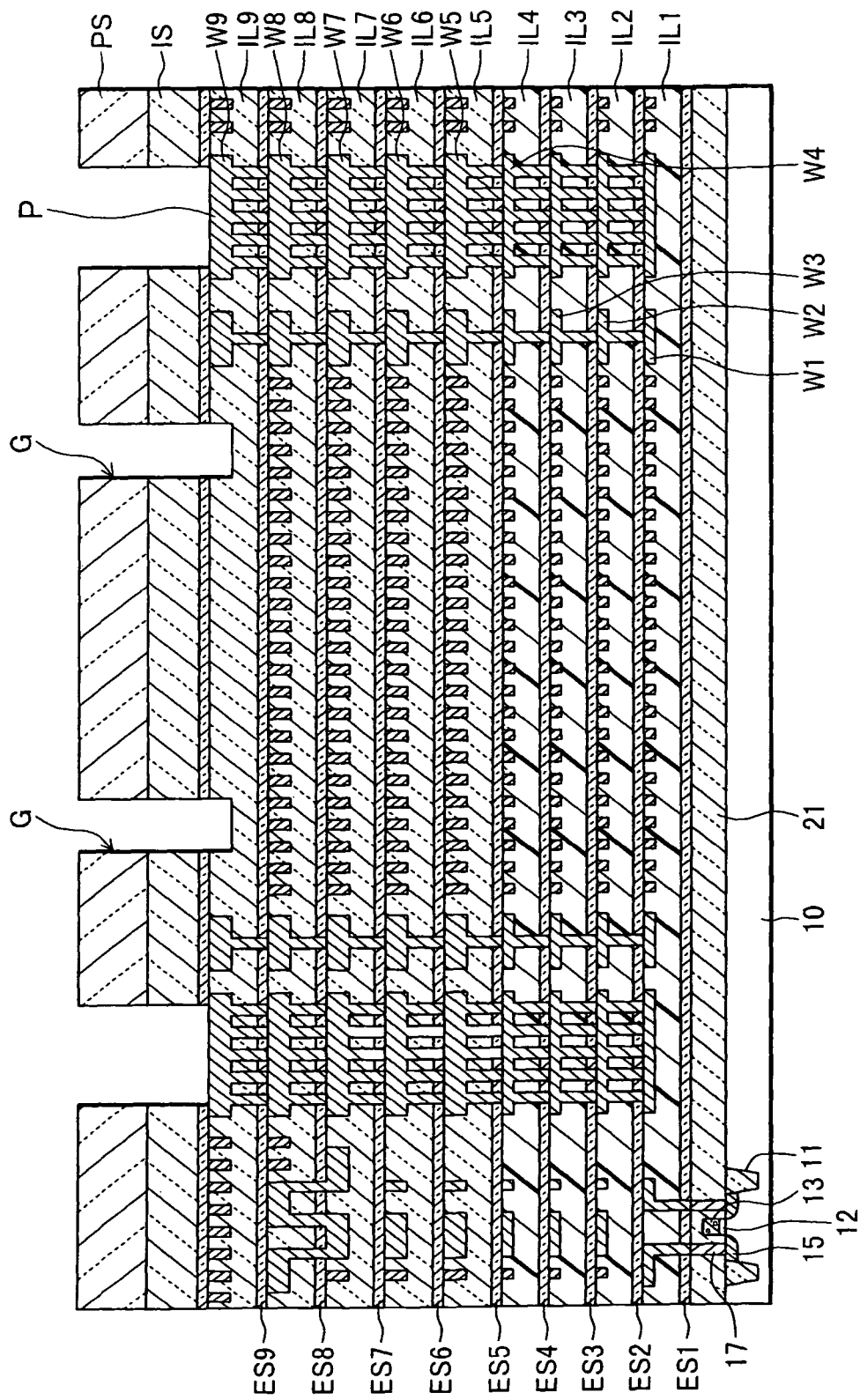
FIG. 16 is a schematic cross sectional view showing the structure of a semiconductor device having ten wiring layers according to a modification of the second embodiment.

FIG. 16 shows an example of the structure obtained when pad opening windows and groove forming windows are formed by different etching processes. Since the pad P opening etching is performed independently from the groove G forming etching, the etching conditions of the pad P opening etching can be selected independently from the etching conditions of the groove G forming etching. By selecting the etching conditions for the groove G forming etching, it is possible to prevent dummy wirings in the wiring layer from being blown and scattered.

Figure 17:
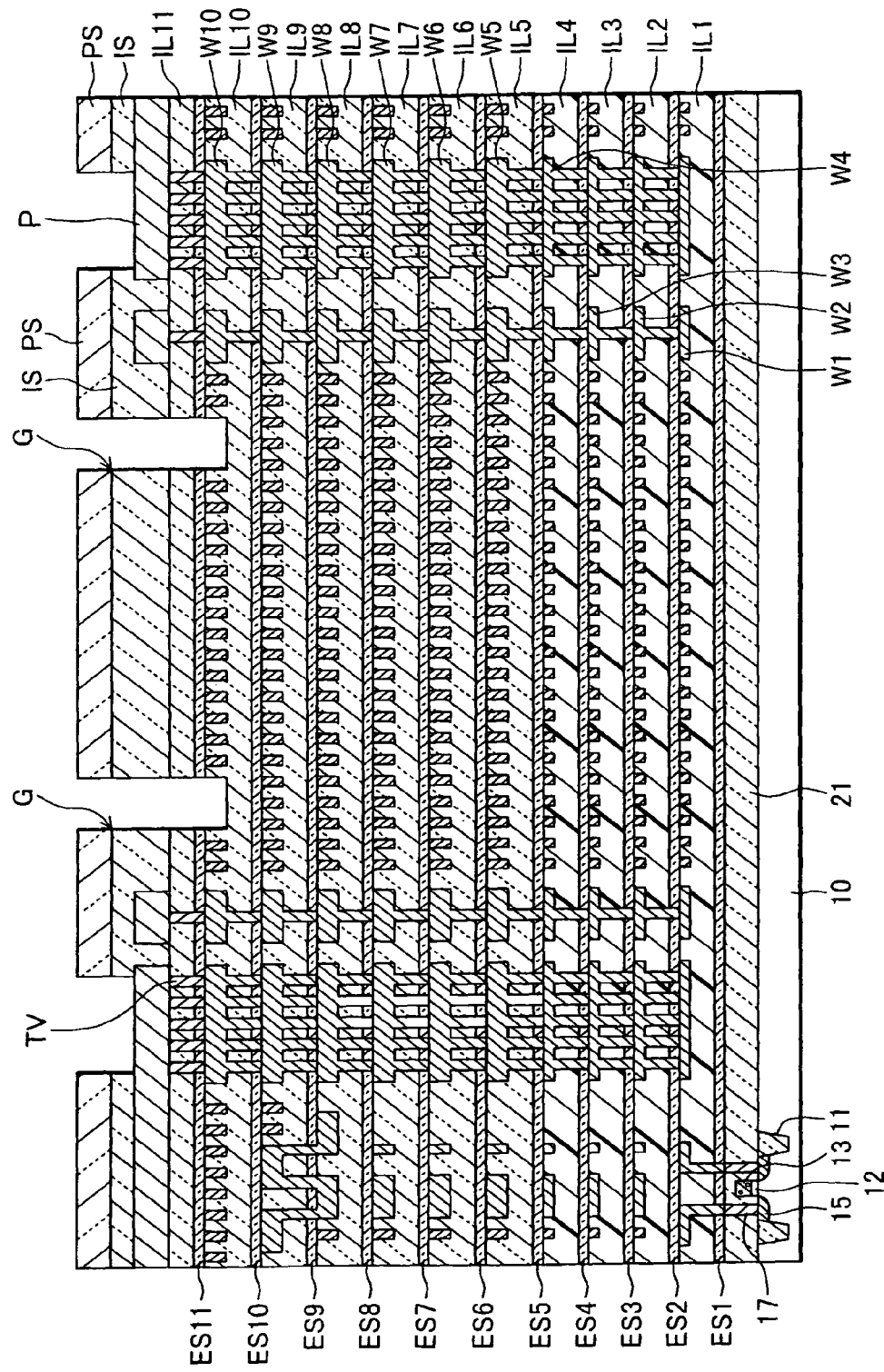
FIG. 17 is a schematic cross sectional view showing the structure of a semiconductor device having ten wiring layers according to a third embodiment.

FIG. 17 shows the structure that although the pad P opening and groove G forming etching processes are executed at the same time, dummy wirings are not formed in an area to which the groove G forming etching progresses. In the structure shown, dummy wirings are not formed in the tenth wiring layer W10 in the grove forming area. Therefore, even the groove enters the tenth interlayer insulating layer IL10, blow and scatter of dummy wirings will not occur during etching because dummy wirings are not formed.

Figure 18:
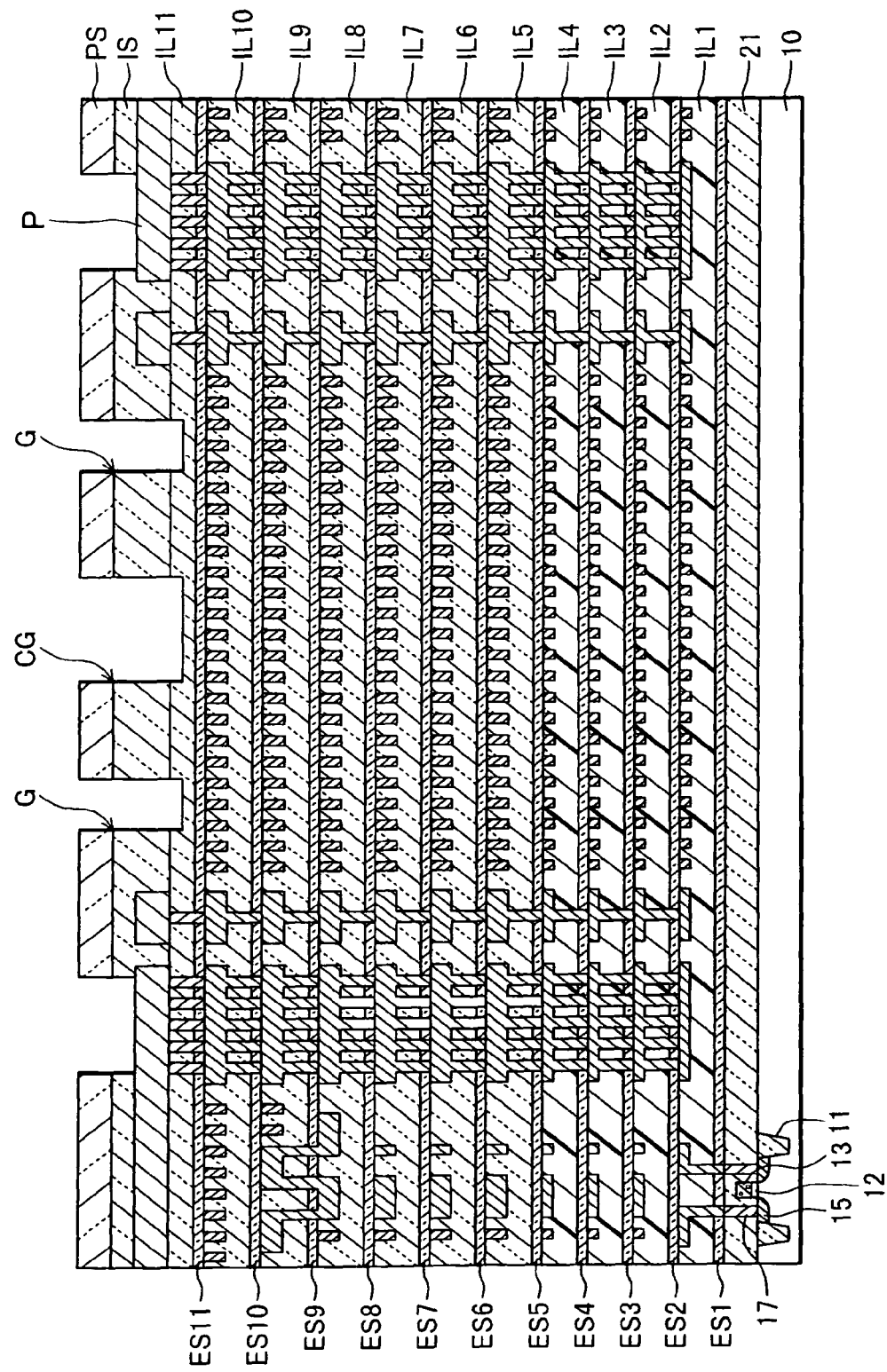
FIG. 18 is a schematic cross sectional view showing the structure of a semiconductor device having ten wiring layers according to a fourth embodiment.

FIG. 18 shows the structure that in the scribe area, opposite side grooves G are formed and a center groove CF is formed in the dicing area. Since the groove CG is formed in the central area of the dicing area, the dicing can be simplified. Since the dicing is performed in an area broader than the center groove CG, the structure after the dicing is expected to have the effects similar to those of the above-described embodiments.

Figure 20A:
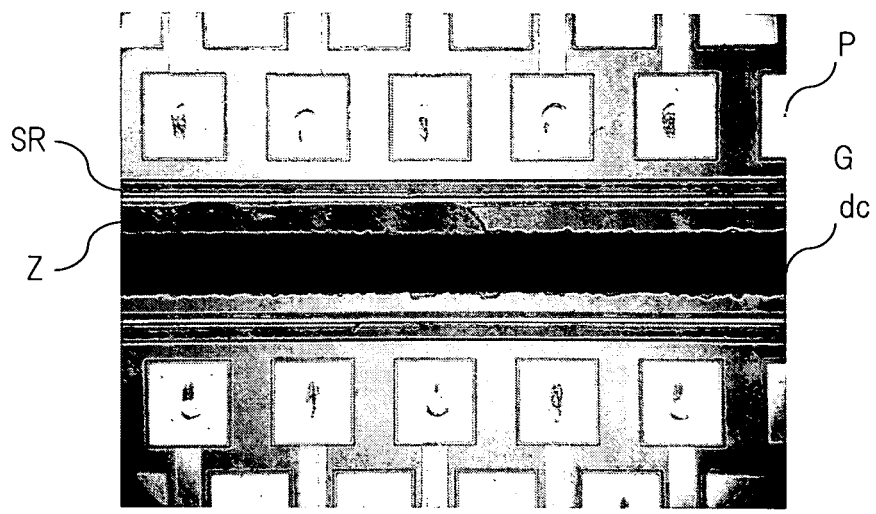
FIGS. 20A and 20B are microscopic photographs showing the upper surfaces of diced wafers.

FIG. 20A is a microscopic photograph of an upper surface of a diced sample having the structure shown in FIG. 17. The central black portion dc is a portion from which the wafer is removed by dicing. A narrow groove G can be seen above the dicing area via a white portion. A portion X under a position corresponding to the groove is partially broken away, in the left side area of the photograph. This can be considered that a crack was formed from the diced area and reached the groove, forming an upward extending crack, and the surface layer was lost. A black stripe portion seen above the groove is a moisture preventive seal ring SR. Upper rectangular areas are pads P.

For the sample shown in FIG. 20A, the first to fourth interlayer insulating films were made of organic insulating layers. The organic insulating layer has a lowest dielectric constant so that parasitic capacitance of the wirings can be lowered. The fifth to eighth interlayer insulating films IL5 to IL8 were made of SiOC layers. Although the SiOC layer has a dielectric constant higher than that of the organic insulating layer, its dielectric constant is lower than that of silicon oxide so that parasitic capacitance of wirings can be reduced correspondingly.

The ninth and tenth interlayer insulating films IL9 and IL10 were made of silicon oxide layers. Although the silicon oxide layer has a dielectric constant higher than that of the organic insulating layer and SiOC, it is a very stable insulator and has a high stability. A wiring pitch of each wiring layer becomes broader as the level becomes higher, and the restrictions of wiring parasitic capacitance become loose. It is therefore desired to reduce the parasitic capacitance of the lower level wirings. This requirements are met by using three types of interlayer insulating films.

A sample was also formed which had the first to fourth wiring layers made of SiOC instead of organic insulating layers.

Figure 20B:

FIG. 20B is a microscopic photograph showing the upper surface of this sample. A lower black portion dc is a portion from which the wafer was removed by dicing. A groove G is formed at a position spaced by a constant distance from the bottom edge, and a seal ring SR is formed above the groove. In the right area of the photograph, the surface portion is lost from the diced side wall to the groove. This can be considered that a crack was formed from the diced side wall and reached near under the groove, forming an upward extending crack, and the surface layer was lost. By positively releasing the stress by using the groove, it is possible to prevent the crack from entering the inside of the chip.

The shape of the groove is not limited to that described above, but various shapes are possible.

Figure 21A:
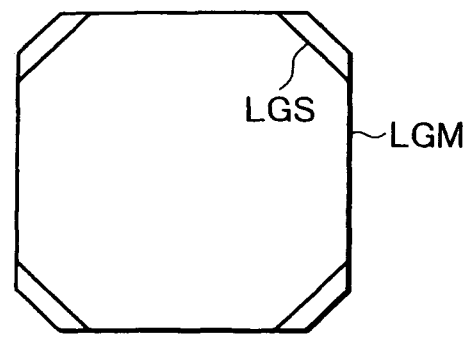
FIGS. 21A-21E are schematic diagrams showing modifications of the shape of a groove to be formed in a groove forming area.

FIG. 21A shows a groove LGM similar to those of the above-described embodiments, the groove LGM having auxiliary grooves LGS at its corners. Invasion of a crack into the corner can be blocked more reliably.

Figure 21B:
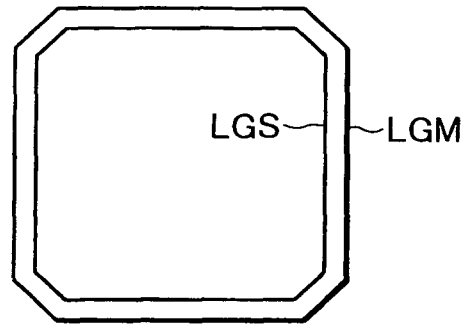

FIG. 21B shows a groove LGM having another looped auxiliary groove LGS. Invasion of a crack can be blocked more reliably over the whole outer circumference.

Figure 21C:
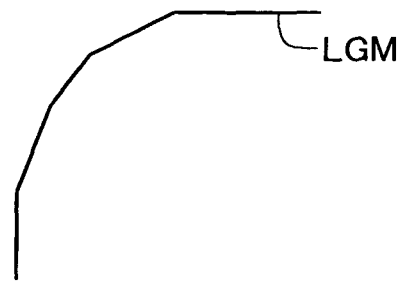
Figure 21D:
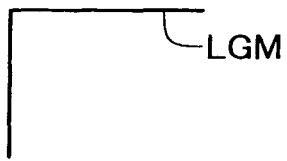

FIG. 21C shows a modification of a corner cutting method. Instead of cutting off the corners of a rectangle along one straight line, the corners are cut off along three straight lines. The number of straight lines is not limited to three, but any plurality of straight lines may be used.

FIG. 21 shows the groove whose corners are not cut off. Although a resistance force against crack invasion becomes weak, the corners may not be cut off if this shape is sufficient.

Figure 21E:
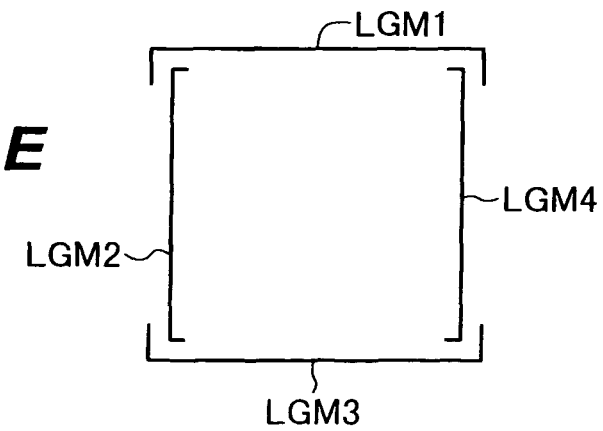

FIG. 21E shows four grooves LGM1 to LGM4 surrounding a chip area. Although the grooves LGM1 to LGM4 are not continuous, the chip area is surrounded in an azimuth manner.

The present invention has been described in connection with the preferred embodiments. The invention is not limited only to the above embodiments. Materials and numerical values may be changed depending upon use objects and the like. It will be apparent to those skilled in the art that other various modifications, improvements, combinations, and the like can be made.

Applicability to Industries

The invention is applicable to semiconductor devices having multilayer wirings. The invention is particularly effective for a semiconductor fabrication method using copper wirings and removing an unnecessary metal layer by CMP.

What I claim are:

1. A semiconductor wafer structure comprising:
a semiconductor wafer having a plurality of chip areas, each formed with semiconductor elements, and scribe areas disposed between the chip areas, and separating said plurality of chip areas, wherein said scribe areas include dicing areas for dicing said semiconductor wafer and groove forming areas between the chip areas and the dicing areas, each of the chip areas being surrounded by one of the groove forming areas;
a multilayer wiring structure formed above said semiconductor wafer, said multilayer wiring structure having interlayer insulating films and wiring layers alternately formed, some of the wiring layers including wiring patterns and dummy wirings;
a cover layer structure including a passivation layer, said cover layer structure covering said multilayer wiring structure; and
a groove of looped configuration formed in the cover layer structure at least through the passivation layer in each of said groove forming areas;
wherein the wiring layers, except for an uppermost one of the wiring layers, which include said dummy wirings collectively have said dummy wirings in said chip areas and in said scribe areas, and also have said dummy wirings in said groove forming areas, and said uppermost one of the wiring layers which include said dummy wirings has said dummy wirings in said chip areas and in said scribe areas excluding the groove forming areas, and a bottom of the grove is higher than the dummy wiring in each of the groove forming areas.

2. The semiconductor wafer structure according to claim 1, wherein a width of said groove is in a range from 0.5 μm to 10 μm.

3. The semiconductor wafer structure according to claim 1, wherein an uppermost wiring layer of said multilayer wiring structure includes a pad, the semiconductor wafer further comprises a pad opening formed through said cover layer structure to expose said pad, and said groove extending through said cover layer and reaching an inside of an underlying interlayer insulating film.

4. The semiconductor wafer structure according to claim 1, further comprising a moisture seal ring of a looped wall shape formed on each of said chip areas, said moisture seal ring being disposed along outer periphery of each of said chip areas and extending through said interlayer insulating films.

5. The semiconductor wafer structure according to claim 1, wherein each of said interlayer insulating films includes a copper diffusion preventive layer capable of preventing copper diffusion and an insulating film formed on said copper diffusion preventive layer, and the interlayer insulating films include layers of different materials for upper and lower levels.

6. The semiconductor wafer structure according to claim 1, wherein said groove has a truncated rectangular loop shape, which is truncated at a position above outside of each corner of said chip area.

7. A semiconductor device comprising:
a semiconductor substrate having a chip area formed with semiconductor elements and a scribe area outside a periphery of said chip area, wherein the scribe area includes a groove forming area surrounding said chip area;
a multilayer wiring structure formed above said semiconductor substrate, said multilayer wiring structure having interlayer insulating films and wiring layers alternately formed, some of the wiring layers including wiring patterns and dummy wirings;
a cover layer structure including a passivation layer, said cover layer structure covering said multilayer wiring structure; and
a first groove of looped configuration formed in the cover layer structure at least through the passivation layer in said groove forming area;
wherein the wiring layers, except for an uppermost one of the wiring layers, which include said dummy wirings collectively have said dummy wirings in said chip area and in said scribe area, and also have said dummy wirings in said groove forming area, and said uppermost one of the wiring layers which include said dummy wirings has said dummy wirings in said chip area and in said scribe area excluding the groove forming area, and a bottom of the first grove is higher than the dummy wiring in the groove forming area.

8. The semiconductor device according to claim 7, wherein a width of said first groove is in a range from 0.5 μm to 10 μm.

9. The semiconductor device according to claim 7, wherein an uppermost wiring layer of said multilayer wiring structure includes a pad, the semiconductor device further comprises a pad opening formed through said cover layer to expose said pad, and said first groove extending through said cover layer and reaching inside of an underlying interlayer insulating film.

10. The semiconductor device according to claim 7, further comprising a moisture seal ring of a looped wall shape formed on the chip area, said moisture seal ring being disposed along outer periphery of said chip area and extending through said interlayer insulating films.

11. The semiconductor device according to claim 7, wherein each of said interlayer insulating films includes a copper diffusion preventive layer capable of preventing copper diffusion and an insulating film formed on said copper diffusion preventive layer, and the interlayer insulating films include layers of different materials for upper and lower levels.

12. The semiconductor device according to claim 7, wherein said first groove has a truncated rectangular loop shape, which is truncated at a position above outside of each corner of said chip area.

13. The semiconductor device according to claim 7, further comprising a second groove formed in said cover layer structure outside of said first groove.

14. The semiconductor device according to claim 13, wherein a bottom of said second groove is lower than a bottom of said first groove.

15. A semiconductor device comprising:
a semiconductor wafer including a first chip area, a second chip area, and a scribe area arranged between the first chip area and the second chip area;
a first insulating layer formed over the semiconductor wafer in the first chip area, in the second chip area and in the scribe area;
first wiring patterns and first dummy wiring patterns, formed in the first insulating layer in the first chip area;
second wiring patterns and second dummy wiring patterns formed in the first insulating layer in the second chip area;
third dummy wiring patterns formed in the first insulating layer in the scribe area;
a second insulating layer formed over the first insulating layer in the first chip area, in the second chip area and in the scribe area;
third wiring patterns and fourth dummy wiring patterns formed in the second insulating layer in the first chip area;
fourth wiring patterns and fifth dummy wiring patterns formed in the second insulating layer in the second chip area;
sixth dummy wiring patterns formed in the second insulating layer in the scribe area;
a third insulating layer formed over the second insulating layer in the first chip area, in the second chip area and in the scribe area;
a first pad formed in the third insulating layer in the first chip area;

a first window formed in the third insulating layer in the first chip area, and exposing the first pad;

a second pad formed in the third insulating layer in the second chip area;

a second window formed in the third insulating layer in the second chip area, and exposing the second pad;

wherein the scribe area includes a dicing area for dicing the semiconductor wafer;

wherein the third insulating film in the scribe area includes a first groove arranged between the dicing area and the first window, and a second groove arranged between the dicing area and the second window;

wherein the sixth dummy wiring patterns exist in the second insulating layer in the dicing area excluding areas under the first groove and under the second groove, and bottoms of the first groove and the second groove are higher than the sixth dummy wiring patterns in the dicing area.

16. The semiconductor device according to claim 15, wherein the first groove and the second groove reach the second insulating layer.

* * * * *